United States Patent
Cheever et al.

(10) Patent No.: US 9,281,793 B2
(45) Date of Patent: Mar. 8, 2016

(54) SYSTEMS, METHODS, AND APPARATUS FOR GENERATING AN AUDIO SIGNAL BASED ON COLOR VALUES OF AN IMAGE

(71) Applicant: uSOUNDit Partners, LLC, San Antonio, TX (US)

(72) Inventors: Jean Cheever, San Antonio, TX (US); Tom Polum, New York, NY (US); Tamra Hayden-Rice, Lakewood, CO (US)

(73) Assignee: uSOUNDit Partners, LLC, San Antonio, TX (US)

( * ) Notice: Subject to any disclaimer, the term of this patent is extended or adjusted under 35 U.S.C. 154(b) by 346 days.

(21) Appl. No.: 13/904,012

(22) Filed: May 28, 2013

(65) Prior Publication Data

US 2013/0322651 A1    Dec. 5, 2013

Related U.S. Application Data

(60) Provisional application No. 61/652,562, filed on May 29, 2012, provisional application No. 61/683,419, filed on Aug. 15, 2012.

(51) Int. Cl.
| | |
|---|---|
| *H03G 5/00* | (2006.01) |
| *G06T 7/40* | (2006.01) |
| *H03G 5/16* | (2006.01) |
| *H03G 5/18* | (2006.01) |
| *H03G 9/00* | (2006.01) |
| *H03G 9/02* | (2006.01) |

(52) U.S. Cl.
CPC *H03G 5/00* (2013.01); *G06T 7/408* (2013.01); *H03G 5/005* (2013.01); *H03G 5/165* (2013.01); *H03G 5/18* (2013.01); *H03G 9/005* (2013.01); *H03G 9/025* (2013.01)

(58) Field of Classification Search
CPC ...................................................... H03G 5/00
USPC .................... 381/101, 107; 84/464 R, 600
See application file for complete search history.

(56) References Cited

U.S. PATENT DOCUMENTS

| | | | |
|---|---|---|---|
| 5,048,390 A | 9/1991 | Adachi et al. | |
| 5,097,326 A | 3/1992 | Meijer | |

(Continued)

FOREIGN PATENT DOCUMENTS

| | | |
|---|---|---|
| EP | 2073193 | 6/2009 |
| WO | WO2007105927 | 9/2007 |

(Continued)

OTHER PUBLICATIONS

Website: "Color Brain" (https://itunes.apple.com/us/app/color-brain/id417611022?mt=12) by BrainScan Software; download date: Sep. 26, 2013; 5 pages.

(Continued)

*Primary Examiner* — Paul S Kim
*Assistant Examiner* — Katherine Faley
(74) *Attorney, Agent, or Firm* — Michael D. Downs; Finham Downs, LLC

(57) ABSTRACT

Systems, apparatus, methods, and articles of manufacture provide for determining tones and/or volumes based on color information associated with an image file. Some embodiments provide for generating tones as background chords, automatically in an auto-play mode, and/or manually (e.g., based on a user touching a touch screen).

20 Claims, 9 Drawing Sheets

(56) References Cited

U.S. PATENT DOCUMENTS

| | | | |
|---|---|---|---|
| 5,286,908 | A | 2/1994 | Jungleib |
| 5,627,335 | A | 5/1997 | Rigopulos |
| 5,689,078 | A * | 11/1997 | McClard ............ 84/600 |
| 6,392,133 | B1 | 5/2002 | Georges |
| 6,523,006 | B1 | 2/2003 | Ellis et al. |
| 6,686,529 | B2 | 2/2004 | Kim |
| 7,236,226 | B2 | 6/2007 | Hung et al. |
| 7,326,846 | B2 | 2/2008 | Terada |
| 7,655,856 | B2 | 2/2010 | Nakamura |
| 7,754,959 | B2 | 7/2010 | Herberger et al. |
| 7,947,888 | B2 | 5/2011 | Lemons |
| 2002/0005108 | A1 * | 1/2002 | Ludwig ............ 84/600 |
| 2002/0094866 | A1 | 7/2002 | Takeda et al. |
| 2009/0122161 | A1 | 5/2009 | Bolkhovitinov |

FOREIGN PATENT DOCUMENTS

| | | |
|---|---|---|
| WO | WO2009065424 | 5/2009 |
| WO | WO2012004650 | 1/2012 |

OTHER PUBLICATIONS

Website: "Hear Colors as Music" (www.pixound.com/main.html) download date: Sep. 26, 2013; 7 pages.

Margounakis, et al. "Converting Images to Music Using Their Colour Properties", Proceeding of the 12th International Conference on Auditory Display, Jun. 20-23, 2006; 8 pages.

Xiaoying Wu, "A Study on Image-Based Music Generation", Simon Fraser University; 2008; 69 pages. [Accessible on-line but copy protected—(http://summit.sfu.ca/item/8920)].

Wu et al. "A Study of Image-Based Music Composition", Multimedia and Expo, 2008 IEEE International Conference on; Simon Fraser University; Jun. 23, 2008-Apr. 26, 2008; 4 pages.

Website: "VirtualANS Visual Synthesizer" (http://www.warmplace.ru/soft/ans/#about) download date: Apr. 22, 2012; 3 pages.

Cambourakis et al., "Soundphotics, Light Into Sound Converter" Electrotechnical Conference, 1994; vol. 3, pp. 1121-1122.

Website: "Say It With Pictures" (http://www.emuscian.com/gear/0769/say-it-with-pictures/141064) by Dennis Miller; Sep. 1, 2008; 8 pages.

* cited by examiner

SYSTEMS, METHODS, AND APPARATUS FOR GENERATING AN AUDIO SIGNAL BASED ON COLOR VALUES OF AN IMAGE

CROSS-REFERENCE TO RELATED APPLICATIONS

This application claims the benefit of priority to the following: (i) U.S. Provisional Patent Application No. 61/652,562, entitled "Systems, Methods and Apparatus for Facilitating Audio Play of Images", filed May 29, 2012; and (ii) U.S. Provisional Patent Application No. 61/683,419, entitled "Systems, Methods and Apparatus for Generating Representations of Images and Audio", filed Aug. 15, 2012. The entire contents of the applications identified above are incorporated by reference in this disclosure.

BRIEF DESCRIPTION OF THE DRAWINGS

An understanding of embodiments described in this disclosure and many of the attendant advantages may be readily obtained by reference to the following detailed description when considered with the accompanying drawings, of which.

DETAILED DESCRIPTION

Figure 1A:
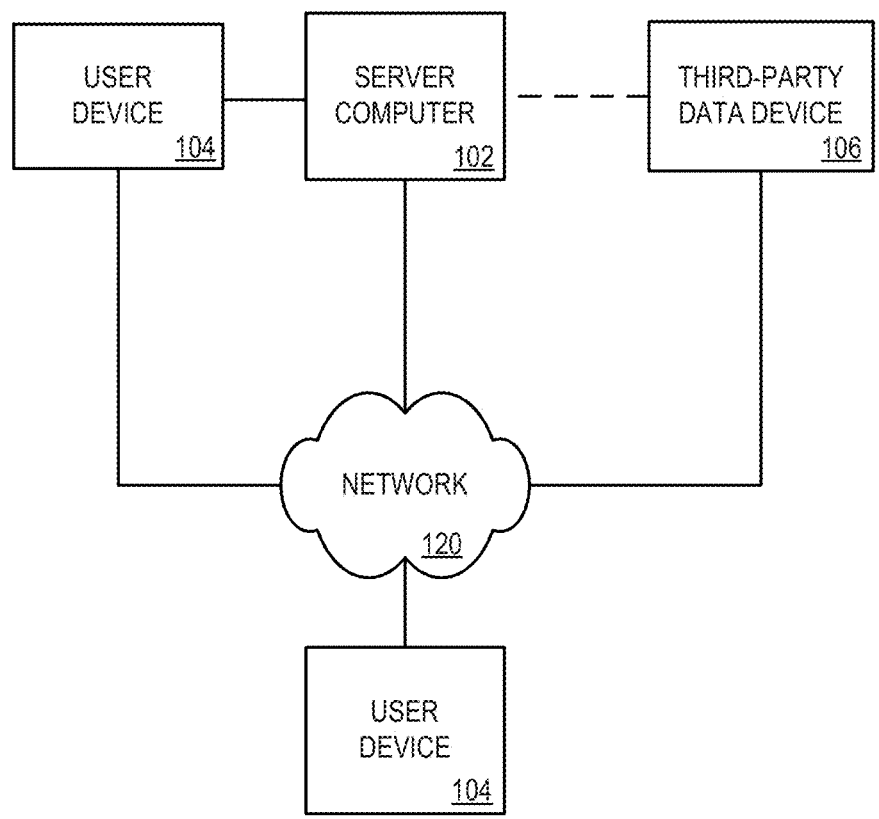
FIG. 1A is a diagram of a system according to some embodiments.

This disclosure relates generally to systems, apparatus, media, and methods for generating representations of images and audio. In particular, this disclosure relates to systems, apparatus, media, and methods for generating and outputting audio signals based on image data (e.g., digital image files). In some embodiments, music based on a digital image file (e.g., a digital photo) may be generated by, recorded by, output via, transmitted from, and/or shared from a user device, such as a portable computing device (e.g., smartphone, tablet computer).

Applicants have recognized that, in accordance with some embodiments described in this disclosure, some types of users may find it beneficial to be able to generate music based on photos and other types of digital images (e.g., using an application running on a tablet computer or other type of computing device).

Applicants further have recognized that, in accordance with some embodiments described in this disclosure, some types of users may find it beneficial to generate audio signals corresponding to tones and/or audio volume based on RGB (red, green, and blue) values and/or HSV (hue, saturation, and brightness) values.

In accordance with some embodiments of the present invention, one or more systems, apparatus, methods, articles of manufacture, and/or (transitory or non-transitory) computer readable media (e.g., a non-transitory computer readable memory storing instructions for directing a processor) provide for one or more of: determining a red value (R), a green value (G), and a blue value (B) (the RGB values) for a pixel of a digital image file; determining a tone for the pixel based on the RGB values; determining a hue value (H), a saturation value (S), and a brightness value (V) (the HSV values) for the pixel; and/or determining a volume (L) for the pixel based on the HSV values and/or the RGB values. One or more embodiments may further provide for recording generated audio (e.g., storing a recorded music file including a plurality of tones corresponding to a digital photo) and/or transmitting, sharing, or otherwise outputting an audio signal that is based on the tone and the volume (e.g., outputting music via a speaker of a mobile device).

In accordance with some embodiments of the present invention, one or more systems, apparatus, methods, articles of manufacture, and/or computer readable media provide for one or more of: determining a difference threshold value; determining a tone for a first pixel of a digital image file based on color information corresponding to the first pixel (e.g., RGB and/or HSV values), color information corresponding to a second pixel, and the difference threshold value; and/or determining a volume for the first pixel of the digital image file based on color information corresponding to the first pixel (e.g., RGB and/or HSV values), color information corresponding to a second pixel, and the difference threshold value.

In accordance with some embodiments of the present invention, a software application (which may be referred to in this disclosure as a music generator application) allows a user to create music by outputting a background chord, auto-playing an image, and/or manually playing an image. In one embodiment, all three modes for creating music may be active at the same time—a user may be playing an image by tapping a touch screen while the software application auto-plays the image and outputs a background chord (e.g., based on one or more selected settings).

As used in this disclosure, a "difference threshold value" may include, for example, a numerical value that may be used, in accordance with some embodiments, for comparing with differences between respective tones and/or respective volumes associated with different pixels. Although any type of value may be utilized in accordance with a particular desirable implementation, in one example a difference threshold value may comprise a value in the range of 0.0 to 1.0. For instance, a difference threshold value for a low color sensitivity may be set at 0.85, and for a high color sensitivity may be set at 0.30.

As used in this disclosure, "computing device" may refer to, without limitation, one or more personal computers, laptop computers, set-top boxes, cable boxes, network storage devices, server computers, media servers, personal media devices, communications devices, display devices, vehicle or dashboard computer systems, televisions, stereo systems, video gaming systems, gaming consoles, cameras, video cameras, MP3 players, mobile devices, mobile telephones, cellular telephones, GPS navigation devices, smartphones, tablet computers, portable video players, satellite media players, satellite telephones, wireless communications devices, and/or personal digital assistants (PDA).

According to some embodiments, a "user device" may comprise one or more types of computing devices that may be used by an end user. Some types of users may find it beneficial to use a mobile device controlled (e.g., by a processor executing computer software application instructions) in accordance with one or more of the embodiments described in this disclosure. In one example, a user device may comprise a smartphone or other personal mobile device. Other types of computing devices that may be used as user devices are discussed in this disclosure, and still others suitable for various embodiments will be apparent to those of ordinary skill in light of this disclosure.

As used in this disclosure, "mobile device" and "portable device" may refer to, without limitation, mobile telephones, cellular telephones, laptop computers, GPS navigation devices, smartphones such as a BLACKBERRY, PALM, WINDOWS 7, IPHONE, GALAXY NEXUS, or DROID phone, tablet computers such as an IPAD by APPLE, SLATE by HP, IDEAPAD by LENOVO, XOOM by MOTOROLA, KINDLE FIRE HD by AMAZON, NOTE II by SAMSUNG, or NEXUS 7 by GOOGLE, a handheld computer, a wearable computer, a personal digital assistant, a cellular telephone, a network appliance, a camera, a smartphone, a network base station, a media player, a navigation device, a game console, a tablet computer, a laptop computer, or any combination of any two or more of such computing devices.

It should be understood that the embodiments described in this disclosure are not limited to use with mobile devices (although some preferred embodiments are described with reference to such devices, for ease of understanding), but are equally applicable to any network device, user device, or other computing device, such as a personal desktop computer with a browser application and Internet access (e.g., in a user's home or office). Any embodiments described with reference to a mobile device in this disclosure should be understood to be equally applicable to any such other types of computing device, as deemed appropriate for any particular implementation(s).

FIG. 1A depicts a block diagram of an example system 100 according to some embodiments. The system 100 may comprise one or more user devices 104 in communication with a controller or server computer 102 (that may also be or comprise a user device, in accordance with some embodiments) via a network 120. Typically a processor (e.g., one or more microprocessors, one or more microcontrollers, one or more digital signal processors) of a user device 104 or server computer 102 will receive instructions (e.g., from a memory or like device), execute those instructions, and perform one or more processes defined by those instructions. Instructions may be embodied, for example, in one or more computer programs and/or one or more scripts.

In some embodiments a server computer 102 and/or one or more of the user devices 104 stores and/or has access to information useful for performing one or more functions described in this disclosure. Such information may include one or more of: (i) image data, such as digital pictures; (ii) settings data, such as user-provided and/or application-provided data relating to information about a user and/or settings (e.g., a chord setting) for use in generating audio signals based on digital images; and/or (iii) music data, such as a music recording created based on a digital photo using a smartphone application.

According to some embodiments, any or all of such data may be stored by or provided via one or more optional third-party data devices 106 of system 100. A third-party data device 106 may comprise, for example, an external hard drive or flash drive connected to a server computer 102, a remote third-party computer system for storing and serving data for use in performing one or more functions described in this disclosure, or a combination of such remote and/or local data devices. In one embodiment, one or more companies and/or end users may subscribe to or otherwise purchase data (e.g., premium settings and/or content data) from a third party and receive the data via the third-party data device 106.

In some embodiments, the server computer 102 may comprise one or more electronic and/or computerized controller devices such as computer servers communicatively coupled to interface with the user devices 104 and/or third-party devices 106 (directly and/or indirectly). The server computer 102 may, for example, comprise PowerEdge™ M910 blade servers manufactured by Dell, Inc. of Round Rock, Tex. which may include one or more Eight-Core Intel® Xeon® 7500 Series electronic processing devices. According to some embodiments, the server computer 102 may be located remote from the user devices 104. The server computer 102 may also or alternatively comprise a plurality of electronic processing devices located at one or more various sites and/or locations.

According to some embodiments, the server computer 102 may store and/or execute specially programmed instructions to operate in accordance with one or more embodiments described in this disclosure. The server computer 102 may, for example, execute one or more programs that facilitate receiving recorded music files, digital photos, and/or other data items from users and/or distributing recorded music files and images to users via the network 120.

In some embodiments, a user device 104 may comprise a desktop computer (e.g., a Dell OptiPlex™ desktop by Dell, Inc.) or a workstation computer (e.g., a Dell Precision™ workstation by Dell Inc.), and/or a mobile or portable computing device, and an application for generating audio based on digital image files is stored locally on the user device 104, which may access information (e.g., settings data) stored on, or provided via, the server computer 102. In another embodiment, the server computer 102 may store some or all of the program instructions for generating audio based on digital images, and the user device 104 may execute the application remotely via the network 120 and/or download from the server computer 102 (e.g., a web server) some or all of the program code for executing one or more of the various functions described in this disclosure.

In one embodiment, a server computer may not be necessary or desirable. For example, some embodiments described in this disclosure may be practiced on one or more devices without a central authority. For instance, a mobile device may store and execute a stand-alone music generator application (e.g., downloaded from an on-line application store). In such an embodiment, any functions described in this disclosure as performed by a server computer and/or data described as stored on a server computer may instead be performed by or stored on one or more other types of devices, such as a mobile device or tablet computer. Additional ways of distributing information and program instructions among one or more user devices 104 and/or server computers 102 will be readily understood by one skilled in the art upon contemplation of the present disclosure.

Figure 1B:
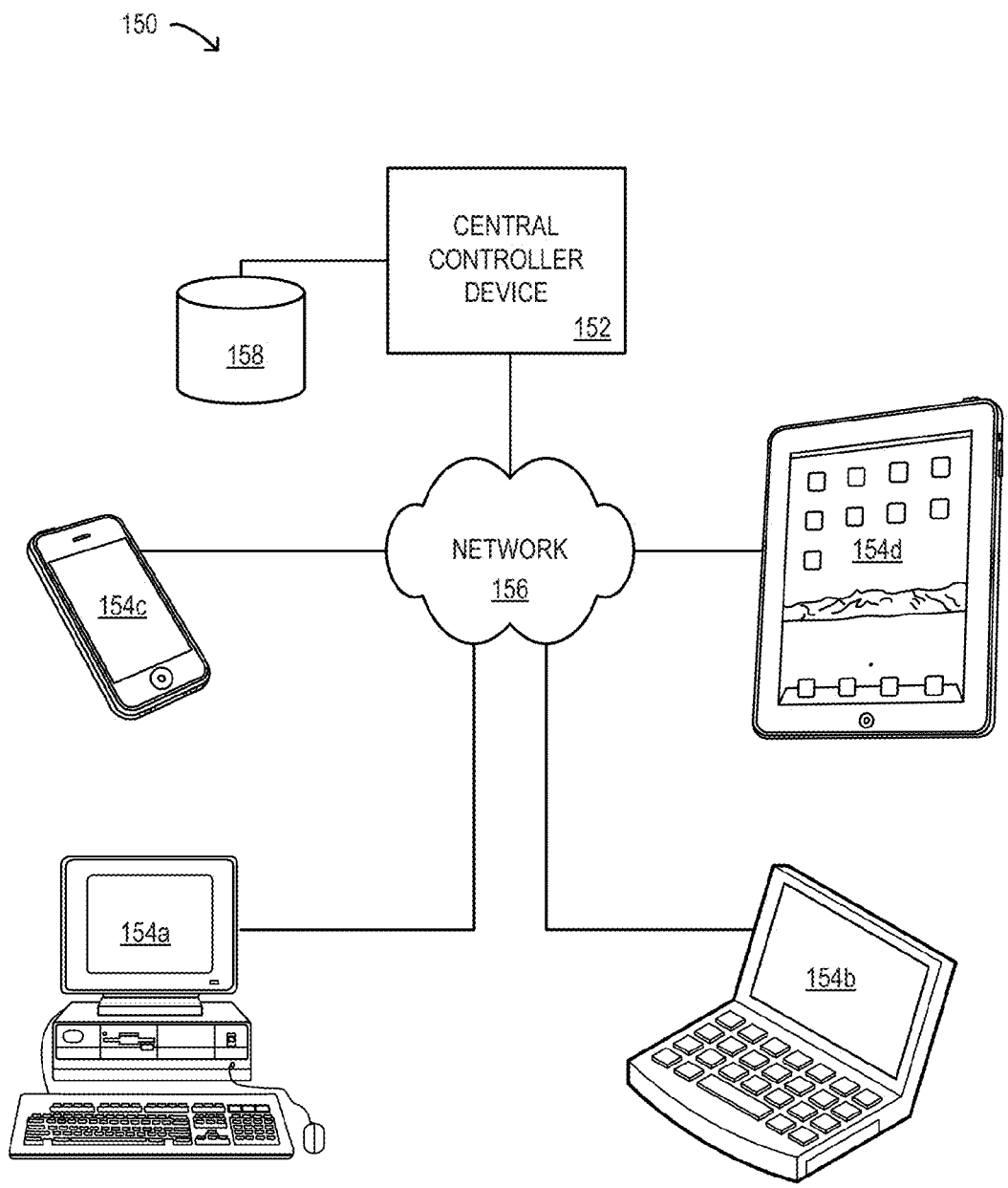
FIG. 1B is a diagram of a system according to some embodiments.

FIG. 1B depicts a block diagram of an example system 150 according to some embodiments. The system 150 may comprise one or more user devices 154a-d in communication with a controller device 152 via a network 156. According to some embodiments, the controller device 152 may be in communication with one or more databases 158.

In some embodiments, the controller device 152 may comprise one or more electronic and/or computerized controller devices such as computer servers communicatively coupled to interface with the user devices 154a-d (directly and/or indirectly). The controller device 152 may, for example, comprise one or more devices as discussed with respect to server computer 102. According to some embodiments, the controller device 152 may be located remote from the user devices 154a-d. The controller device 152 may also or alternatively comprise a plurality of electronic processing devices located at one or more various sites and/or locations.

The user devices 154a-d, in some embodiments, may comprise any types or configurations of mobile electronic network, user, and/or communication devices that are or become known or practicable. User devices 154a-d may, for example, comprise cellular and/or wireless telephones such as an iPhone® manufactured by Apple, Inc. of Cupertino, Calif. or Optimus™ S smart phones manufactured by La) Electronics, Inc. of San Diego, Calif., and running the Android® operating system from Google, Inc. of Mountain View, Calif. The user device 154a may, as depicted for example, comprise a personal or desktop computer (PC), the user device 154b may comprise a laptop computer, the user device 154c may comprise a smartphone, and the user device 154d may comprise a tablet computer.

Typically a processor (e.g., one or more microprocessors, one or more microcontrollers, one or more digital signal processors) of a user device 154a-d or controller device 152 will receive specially programmed instructions (e.g., from a memory or like device), execute those instructions, and perform one or more processes defined by those instructions. Instructions may be embodied for example, in one or more computer programs and/or one or more scripts.

In some embodiments a controller device 152 and/or one or more of the user devices 154a-d stores and/or has access to data useful for providing one or more functions described in this disclosure, in a manner similar to that described with respect to system 100. In some embodiments, a controller device 152 and/or database 158 may not be necessary or desirable. For example, user devices 154a-d may be executing stand-alone applications (e.g., smartphone apps) and may be able to communicate with each other via network 156 (e.g., for sharing image files and/or recorded music files).

Figure 2:
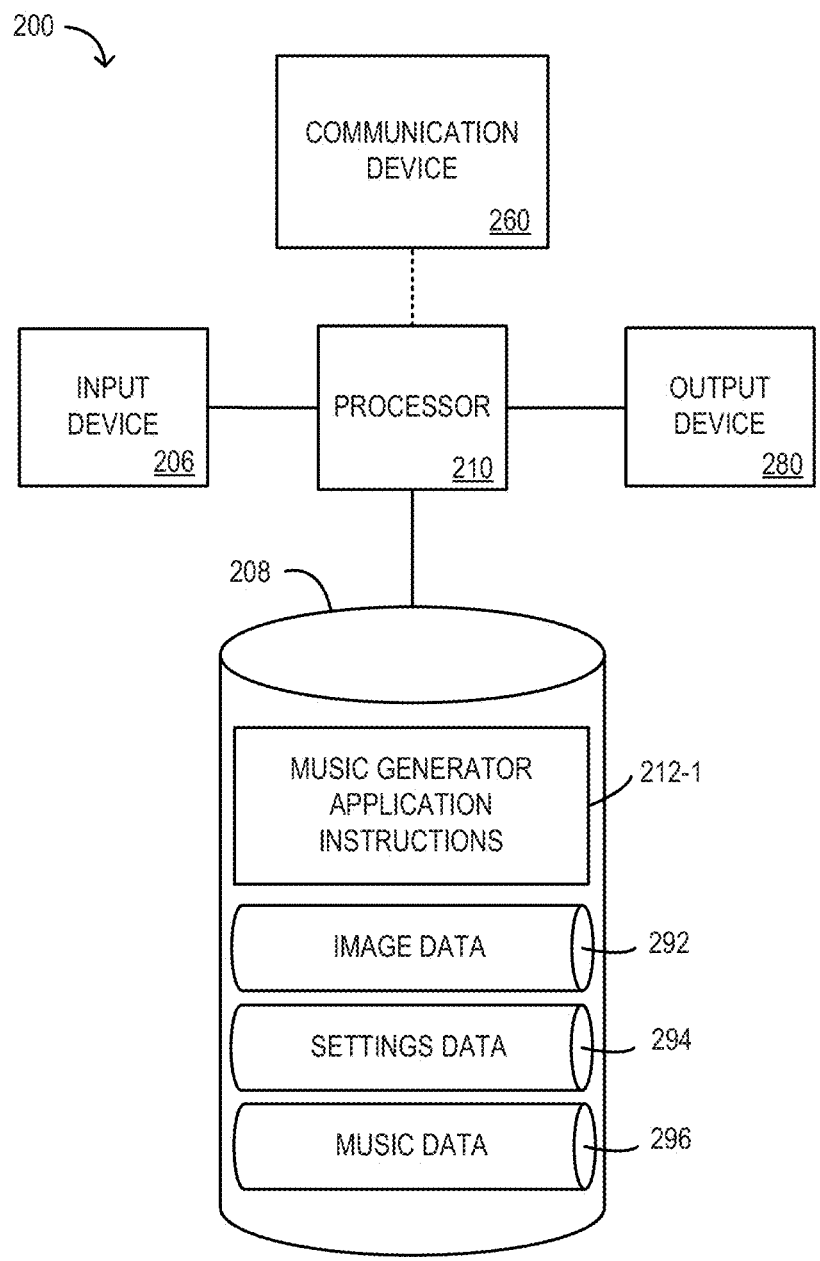
FIG. 2 is a diagram of a computing device according to some embodiments.

Turning to FIG. 2, a block diagram of an apparatus 200 according to some embodiments is shown. In some embodiments, the apparatus 200 may be similar in configuration and/or functionality to any of the user devices 104, server computer 102, and/or third-party data device 106 of FIG. 1A, and/or any of the controller device 152 and/or user devices 154a-d of FIG. 1B. The apparatus 200 may, for example, execute, process, facilitate, and/or otherwise be associated with any of the example processes or interfaces described in conjunction with any of the flowcharts in this disclosure.

In some embodiments, the apparatus 200 may comprise an input device 206, a memory device 208, a processor 210, a communication device 260, and/or an output device 280. Fewer or more components and/or various configurations of the components 206, 208, 210, 260, 280 may be included in the apparatus 200 without deviating from the scope of embodiments described in this disclosure.

According to some embodiments, the processor 210 may be or include any type, quantity, and/or configuration of processor that is or becomes known. The processor 210 may comprise, for example, an Intel® IXP 2800 network processor or an Intel® XEON™ processor coupled with an Intel® E7501 chipset. In some embodiments, the processor 210 may comprise multiple inter-connected processors, microprocessors, and/or micro-engines. According to some embodiments, the processor 210 (and/or the apparatus 200 and/or other components thereof) may be supplied power via a power supply (not shown) such as a battery, an Alternating Current (AC) source, a Direct Current (DC) source, an AC/DC adapter, solar cells, and/or an inertial generator. In the case that the apparatus 200 comprises a server such as a blade server, necessary power may be supplied via a standard AC outlet, power strip, surge protector, and/or Uninterruptible Power Supply (UPS) device.

In some embodiments, the input device 206 and/or the output device 280 are communicatively coupled to the processor 210 (e.g., via wired and/or wireless connections and/or pathways) and they may generally comprise any types or configurations of input and output components and/or devices that are or become known, respectively.

The input device 206 may comprise, for example, a physical and/or virtual keyboard that allows an operator of the apparatus 200 to interface with the apparatus 200 (e.g., such as to enter data or compose an electronic message). The input device 206 may comprise, for example, one or more of a pointer device (e.g., a mouse), a camera, and/or a headphone jack. Input device 206 may include one or more of a keypad, touch screen, or other suitable tactile input device. Input device 206 may include a microphone comprising a transducer adapted to provide audible input of a signal that may be transmitted (e.g., to the processor 210 via an appropriate communications link) and/or an accelerometer or other device configured to detect movement of the device.

The output device 280 may, according to some embodiments, comprise a display screen and/or other practicable output component and/or device. The output device 280 may, for example, provide an indication of a digital image and/or a representation of a digital image being "played" by highlighting or otherwise identifying visually locations of the digital image in coordination with playing respective tones corresponding to the locations (e.g., specific colors or pixels). Output device 280 may include one or more speakers comprising a transducer adapted to provide audible output based on a signal received (e.g., via processor 210), such as for outputting musical tones corresponding to colors in a digital photo.

According to some embodiments, the input device 206 and/or the output device 280 may comprise and/or be embodied in a single device, such as a touch-screen display.

In some embodiments, the communication device 260 may comprise any type or configuration of communication device that is or becomes known or practicable. The communication device 260 may, for example, comprise a network interface card (NIC), a telephonic device, a cellular network device, a router, a hub, a modem, and/or a communications port or cable. In some embodiments, the communication device 260 may be coupled to provide data to a telecommunications device. The communication device 260 may, for example, comprise a cellular telephone network transmission device that sends signals to a server in communication with a plurality of handheld, mobile and/or telephone devices. According to some embodiments, the communication device 260 may also or alternatively be coupled to the processor 210.

Communication device 260 may include, for example, a receiver and a transmitter configured to communicate via signals according to one or more suitable data and/or voice communication systems. In some embodiments, the communication device 260 may comprise an IR, RF, Bluetooth™, and/or Wi-Fi® network device coupled to facilitate communications between the processor 210 and another device (such as one or more mobile devices, server computers, central controllers, and/or third-party data devices). For example, communication device 260 may communicate voice and/or data over mobile telephone networks such as GSM, CDMA, CDMA2000, EDGE or UMTS. Alternatively, or in addition, communication device 260 may include receiver/transmitters for data networks including, for example, any IEEE 802.x network such as WiFi or Bluetooth™.

The memory device 208 may comprise any appropriate information storage device that is or becomes known or available, including, but not limited to, units and/or combinations of magnetic storage devices (e.g., a hard disk drive), optical storage devices, and/or semiconductor memory devices such as Random Access Memory (RAM) devices, Read Only Memory (ROM) devices, Single Data Rate Random Access Memory (SDR-RAM), Double Data Rate Random Access Memory (DDR-RAM), and/or Programmable Read Only Memory (PROM).

The memory device 208 may, according to some embodiments, music generator application instructions 212-1 (e.g., as non-transitory computer-readable software code), image data 292, settings data 294, and/or music data 296. In some embodiments, the music generator application instructions 212-1 may be utilized by the processor 210 to provide output information (e.g., via the output device 280 and/or the communication device 260 of the user devices 104 and/or 154a-d of FIG. 1A and FIG. 1B, respectively).

According to some embodiments, music generator application instructions 212-1 may be operable to cause the processor 210 to process image data 292 and/or settings data 294 as described in this disclosure, for example, to generate or otherwise determine at least one tone and/or volume corresponding to a digital image file and/or output image-based music (e.g., via a user's mobile device). In some embodiments, determined music information (e.g., tone and/or volume information) may be stored locally and/or remotely in a music data database (e.g., music data 296).

Any or all of the exemplary instructions and data types and other practicable types of data may be stored in any number, type, and/or configuration of memory devices that is or becomes known. The memory device 208 may, for example, comprise one or more data tables or files, databases, table spaces, registers, and/or other storage structures. In some embodiments, multiple databases and/or storage structures (and/or multiple memory devices 208) may be utilized to store information associated with the apparatus 200. According to some embodiments, the memory device 208 may be incorporated into and/or otherwise coupled to the apparatus 200 (e.g., as shown) or may simply be accessible to the apparatus 200 (e.g., externally located and/or situated).

Figure 3:
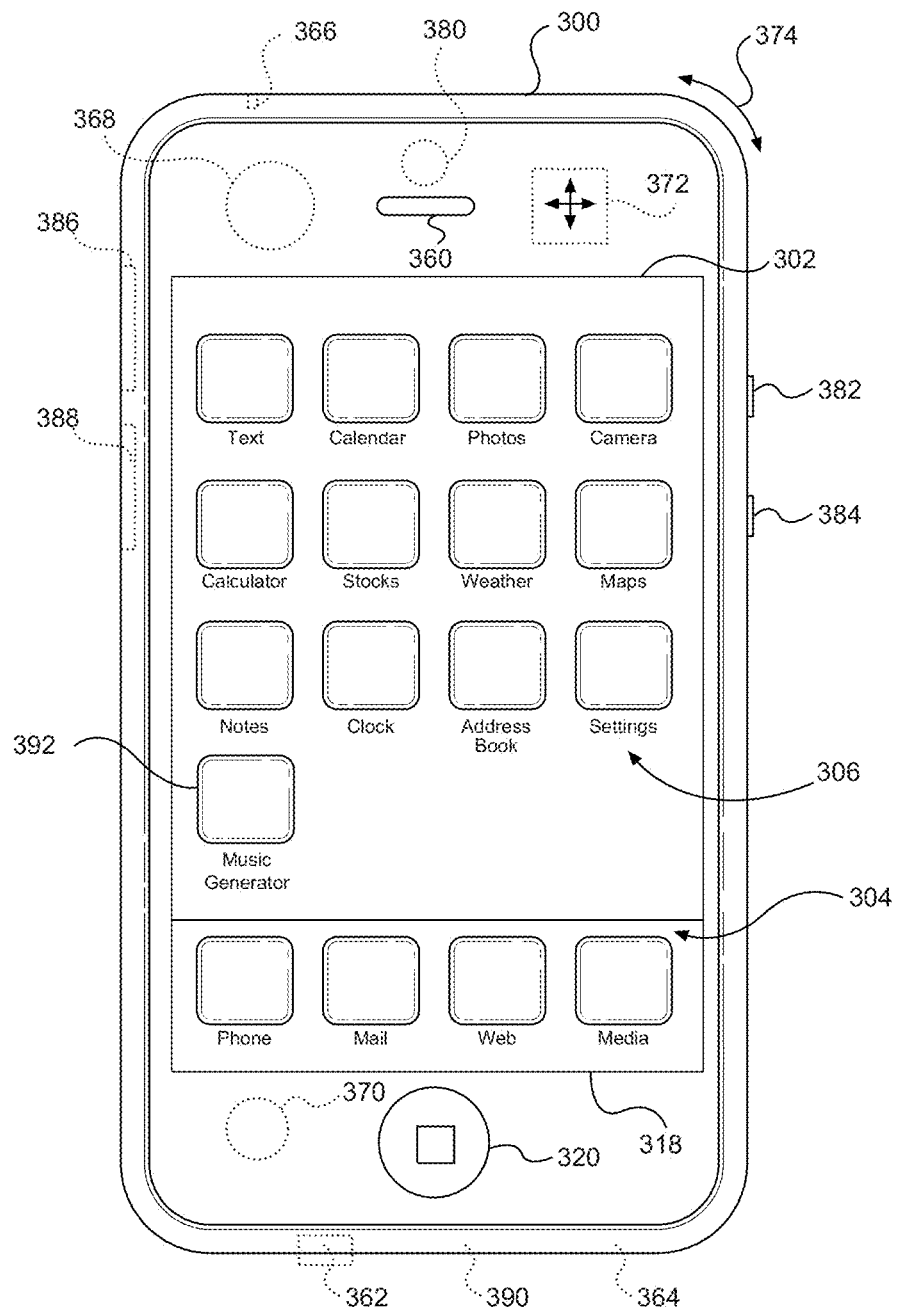
FIG. 3 is a diagram of a mobile device according to some embodiments.

Turning to FIG. 3, a block diagram of an example mobile device 300 according to some embodiments is shown. In some embodiments, the mobile device 300 comprises a touch-sensitive display 302. The touch-sensitive display may be implemented with liquid crystal display (LCD) technology, light emitting polymer display (LPD) technology, or some other display technology. The touch-sensitive display 302 may be sensitive to haptic and/or tactile contact with a user. In some embodiments, the touch-sensitive display 302 may comprise a multi-touch-sensitive display that can, for example, process multiple simultaneous touch points, including processing data related to the pressure, degree, and/or position of each touch point. Such processing facilities gestures and interactions with multiple fingers, chording, and other interactions. Alternately or in addition, other touch-sensitive display technologies may be used, such as, without limitation, a display in which contact is made using a stylus or other pointing device.

In some embodiments, the mobile device 300 may be adapted to display one or more graphical user interfaces on a display (e.g., touch-sensitive display 302) for providing user access to various system objects and/or for conveying information to the user. In some embodiments, the graphical user interface may include one or more display objects 304, 306, such as icons or other graphic representations of respective system objects. Some examples of system objects include, without limitation, device functions, applications, windows, files, alerts, events, or other identifiable system objects.

In some embodiments, the mobile device 300 may implement multiple device functionalities, such as a telephony device, an e-mail device, a network data communication device, a Wi-Fi base station device (not shown), and a media processing device. In some embodiments, particular display objects 304 may be displayed in a menu bar 318. In some embodiments, device functionalities may be accessed from a top-level graphical user interface, such as the graphical user interface illustrated in FIG. 3. Touching one of the display objects 304 can, for example, invoke corresponding functionality. For example, touching the display object would invoke an email application on the mobile device 300 for sending email messages.

In some embodiments, the mobile device 300 may implement network distribution functionality. For example, the functionality may enable the user to take the mobile device 300 and provide access to its associated network while traveling. In particular, the mobile device 300 may extend Internet access (e.g., Wi-Fi) to other wireless devices in the vicinity. For example, mobile device 300 may be configured as a base station for one or more devices. As such, mobile device 300 may grant or deny network access to other wireless devices.

In some embodiments, upon invocation of device functionality, the graphical user interface of the mobile device 300 changes, or is augmented or replaced with another user interface or user interface elements, to facilitate user access to particular functions associated with the corresponding device functionality. For example, in response to a user touching a phone object, the graphical user interface of the touch-sensitive display 302 may present display objects related to various phone functions; likewise, touching of an email object may cause the graphical user interface to present display objects related to various e-mail functions; touching a Web object may cause the graphical user interface to present display objects related to various Web-surfing functions; and touching a media player object may cause the graphical user interface to present display objects related to various media processing functions.

In some embodiments, the top-level graphical user interface environment or state of FIG. 3 may be restored by pressing a button 320 of the mobile device 300. In some embodiments, each corresponding device functionality may have corresponding "home" display objects displayed on the touch-sensitive display 302, and the top-level graphical user interface environment of FIG. 3 may be restored by pressing the "home" display object.

In some embodiments, the top-level graphical user interface may include display objects 306, such as a short messaging service (SMS) object and/or other type of messaging object, a calendar object, a photos object, a camera object, a calculator object, a stocks object, a weather object, a maps object, a notes object, a clock object, an address book object, a settings object, and/or one or more types of display objects having corresponding respective object environments and functionality.

Touching the example "Music Generator" object 392 may, for example, invoke an image representation services environment and/or music generation services environment, and supporting functionality, as described in this disclosure with respect to various embodiments; likewise, a selection of any of the display objects 306 may invoke a corresponding object environment and functionality.

Additional and/or different display objects may also be displayed in the graphical user interface of FIG. 3. For example, if the device 300 is functioning as a base station for other devices, one or more "connection" objects may appear in the graphical user interface to indicate the connection. In some embodiments, the display objects 306 may be configured by a user, e.g., a user may specify which display objects 306 are displayed, and/or may download additional applications or other software that provides other functionalities and corresponding display objects.

In some embodiments, the mobile device 300 may include one or more input/output (I/O) devices and/or sensor devices. For example, a speaker 360 and a microphone 362 may be included to facilitate voice-enabled functionalities, such as phone and voice mail functions. In some embodiments, an up/down button 384 for volume control of the speaker 360 and the microphone 362 may be included. The mobile device 300 may also include an on/off button 382 for a ring indicator of incoming phone calls. In some embodiments, a loudspeaker 364 may be included to facilitate hands-free voice functionalities, such as speaker phone functions. An audio jack 366 may also be included for use of headphones and/or a microphone.

In some embodiments, a proximity sensor 368 may be included to facilitate the detection of the user positioning the mobile device 300 proximate to the user's ear and, in response, to disengage the touch-sensitive display 302 to prevent accidental function invocations. In some embodiments, the touch-sensitive display 302 may be turned off to conserve additional power when the mobile device 300 is proximate to the user's ear.

Other sensors may also be used. For example, in some embodiments, an ambient light sensor 370 may be utilized to facilitate adjusting the brightness of the touch-sensitive display 302. In some embodiments, an accelerometer 372 may be utilized to detect movement of the mobile device 300, as indicated by the directional arrow 374. Accordingly, display objects and/or media may be presented according to a detected orientation, e.g., portrait or landscape.

In some embodiments, the mobile device 300 may include circuitry and sensors for supporting a location determining capability, such as that provided by the global positioning system (GPS) or other positioning systems (e.g., systems using Wi-Fi access points, television signals, cellular grids, Uniform Resource Locators (URLs)). In some embodiments, a positioning system (e.g., a GPS receiver) may be integrated into the mobile device 300 (e.g., embodied as a mobile type of user device, such as a tablet computer or smartphone) or provided as a separate device that may be coupled to the mobile device 300 through an interface (e.g., via communication device 260) to provide access to location-based services.

In some embodiments, a port device 390, e.g., a Universal Serial Bus (USB) port, or a docking port, or some other wired port connection, may be included in mobile device 300. The port device 390 may, for example, be utilized to establish a wired connection to other computing devices, such as other communication devices 300, network access devices, a personal computer, a printer, a display screen, or other processing devices capable of receiving and/or transmitting data. In some embodiments, the port device 390 allows the mobile device 300 to synchronize with a host device using one or more protocols, such as, for example, the TCP/IP, HTTP, UDP and any other known protocol.

The mobile device 300 may also include a camera lens and sensor 380. In some embodiments, the camera lens and sensor 380 may be located on the back surface of the mobile device 300. The camera may capture still images and/or video.

The mobile device 300 may also include one or more wireless communication subsystems, such as an 802.11b/g communication device 386, and/or a Bluetooth™ communication device 388. Other communication protocols may also be supported, including other 802.x communication protocols (e.g., WiMax, Wi-Fi, 3G), code division multiple access (CDMA), global system for mobile communications (GSM), Enhanced Data GSM Environment (EDGE), etc.

Figure 4:
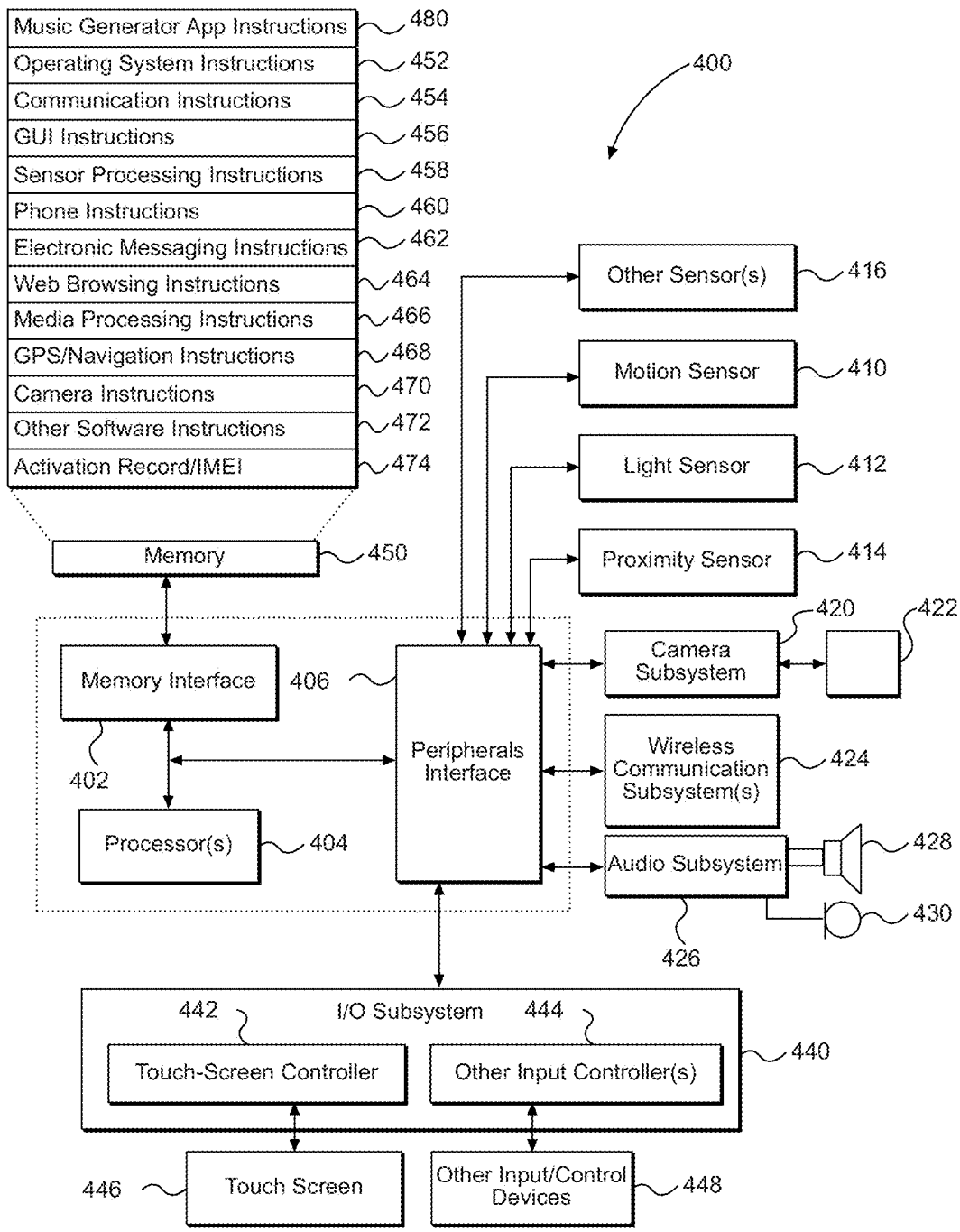
FIG. 4 is a diagram of a mobile device according to some embodiments.

FIG. 4 is a block diagram of an example architecture for the mobile device of FIG. 3. The mobile device 300 may include a memory interface 402, one or more data processors, image processors and/or central processing units 404, and a peripherals interface 406. The memory interface 402, the one or more processors 404 and/or the peripherals interface 406 may be separate components or may be integrated in one or more integrated circuits. The various components in the mobile device 300 may be coupled by one or more communication buses or signal lines.

Sensors, devices, and subsystems may be coupled to the peripherals interface 406 to facilitate multiple functionalities. For example, a motion sensor 410, a light sensor 412, and a proximity sensor 414 may be coupled to the peripherals interface 406 to facilitate the orientation, lighting, and proximity functions described with respect to FIG. 3. Other sensors 416 may also be connected to the peripherals interface 406, such as a positioning system (e.g., GPS receiver), a temperature sensor, a biometric sensor, or other sensing device, to facilitate related functionalities.

A camera subsystem 420 and an optical sensor 422, e.g., a charged coupled device (CCD) or a complementary metal-oxide semiconductor (CMOS) optical sensor, may be utilized to facilitate camera functions, such as recording photographs and video clips.

Communication functions may be facilitated through one or more wireless communication subsystems 424, which may include radio frequency receivers and transmitters and/or optical (e.g., infrared) receivers and transmitters. The specific design and embodiment of the communication subsystem 424 may depend on the communication network(s) over which the mobile device 300 is intended to operate. For example, a mobile device 300 may include communication subsystems 424 designed to operate over a GSM network, a GPRS network, an EDGE network, a Wi-Fi or WiMax network, and a Bluetooth™ network. In particular, the wireless communication subsystems 424 may include hosting protocols such that the device 300 may be configured as a base station for other wireless devices.

An audio subsystem 426 may be coupled to a speaker 428 and a microphone 430 to facilitate voice-enabled functions, such as voice recognition, voice replication, digital recording, and telephony functions.

The I/O subsystem 440 may include a touch screen controller 442 and/or other input controller(s) 444. The touch-screen controller 442 may be coupled to a touch screen 446. The touch screen 446 and touch screen controller 442 can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen 446.

The other input controller(s) 444 may be coupled to other input/control devices 448, such as one or more buttons, rocker switches, thumb-wheel, infrared port, USB port, and/or a pointer device such as a stylus. The one or more buttons (not shown) may include an up/down button for volume control of the speaker 428 and/or the microphone 430.

In one embodiment, a pressing of the button for a first duration may disengage a lock of the touch screen 446; and a pressing of the button for a second duration that is longer than the first duration may turn power to the mobile device 300 on or off. The user may be able to customize a functionality of one or more of the buttons. The touch screen 446 can, for example, also be used to implement virtual or soft buttons and/or a keyboard.

In some embodiments, the mobile device 300 may present recorded audio and/or video files, such as MP3, AAC, and MPEG files. In some embodiments, the mobile device 300 may include the functionality of an MP3 player or other type of media player. Other input/output and control devices may also be used.

The memory interface 402 may be coupled to memory 450. The memory 450 may include high-speed random access memory and/or non-volatile memory, such as one or more magnetic disk storage devices, one or more optical storage devices, and/or flash memory (e.g., NAND, NOR). The memory 450 may store an operating system 452, such as Darwin, RTXC, LINUX, UNIX, OS X, WINDOWS, or an embedded operating system such as VxWorks. The operating system 452 may include instructions for handling basic system services and for performing hardware dependent tasks. In some embodiments, the operating system 452 may be a kernel (e.g., UNIX kernel).

The memory 450 may also store communication instructions 454 to facilitate communicating with one or more additional devices, one or more computers and/or one or more servers.

The memory 450 may include graphical user interface instructions 456 to facilitate graphic user interface processing; sensor processing instructions 458 to facilitate sensor-related processing and functions; phone instructions 460 to facilitate phone-related processes and functions; electronic messaging instructions 462 to facilitate electronic-messaging related processes and functions; web browsing instructions 464 to facilitate web browsing-related processes and functions; media processing instructions 466 to facilitate media processing-related processes and functions; GPS/Navigation instructions 468 to facilitate GPS and navigation-related processes and instructions; camera instructions 470 to facilitate camera-related processes and functions; and/or other software instructions 472 to facilitate other processes and functions, e.g., security processes and functions.

The memory 450 may also store music generator app instructions 480 for facilitating the creation of music or other types of audio output based on digital image files. In some embodiments, music generator app instructions 480 allow a user to select (e.g., from memory 450) and/or capture a digital image (e.g., using camera subsystem 420), review and/or select (e.g., via touch screen 446) one or more settings for generating audio output, play and/or initiate auto-play of a digital image (e.g., to produce audible output via speaker 428), record a file including generated audio signals, and/or transmit (e.g., via wireless communication subsystem(s) 424) audio files and/or image files to at least one other user and/or remote server.

The memory 450 may also store other software instructions (not shown), such as web video instructions to facilitate web video-related processes and functions, and/or web shopping instructions to facilitate web shopping-related processes and functions. In some embodiments, the media processing instructions 466 are divided into audio processing instructions and video processing instructions to facilitate audio processing-related processes and functions and video processing-related processes and functions, respectively. An activation record and International Mobile Equipment Identity (IMEI) 474 or similar hardware identifier may also be stored in memory 450.

Each of the above identified instructions and applications may correspond to a set of instructions for performing one or more functions described above. These instructions need not be implemented as separate software programs, procedures, or modules. The memory 450 may include additional instructions or fewer instructions. Furthermore, various functions of the mobile device 300 may be implemented in hardware and/or in software, including in one or more signal processing and/or application specific integrated circuits.

Figure 5:
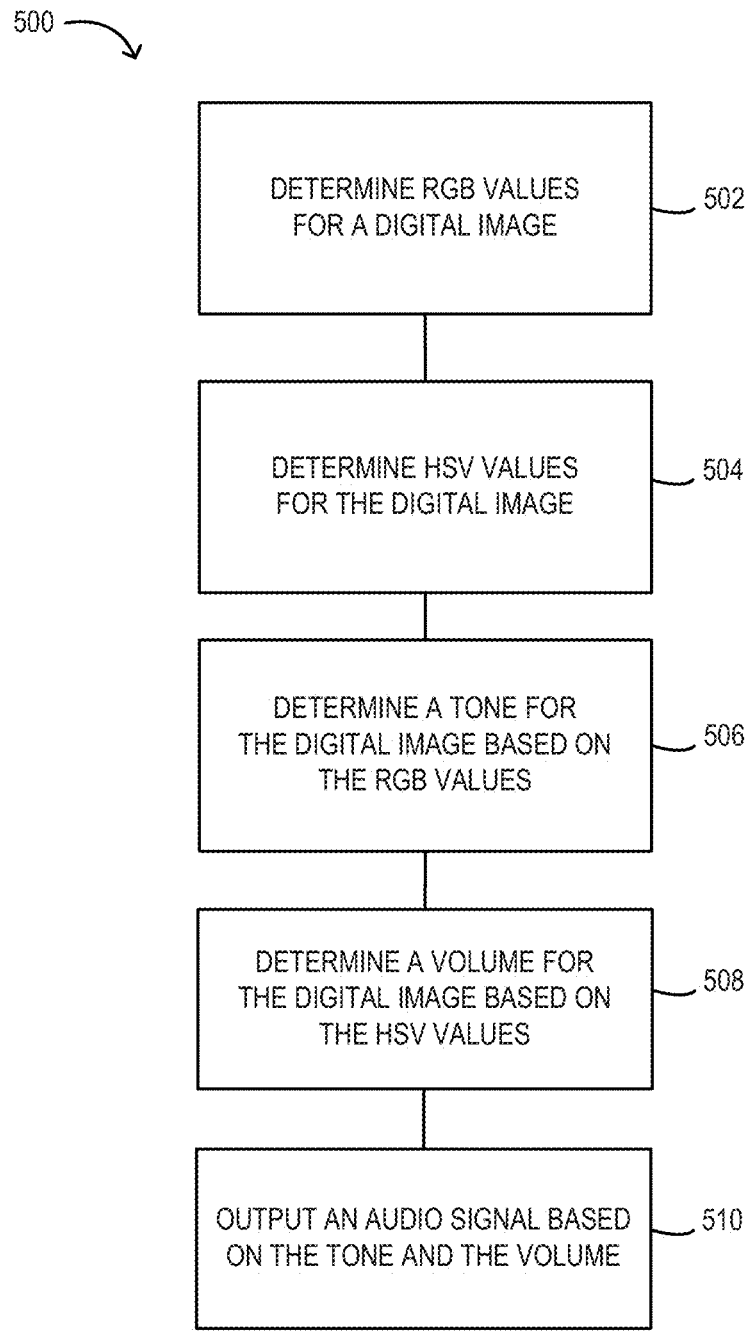
FIG. 5 is a flowchart of a method according to some embodiments.

Referring now to FIG. 5, a flow diagram of a method 500 according to some embodiments is shown. The method 500 may be described in this disclosure as being performed by a user device (e.g., a user's mobile device, such as a phone or tablet computer). However, according to some embodiments, one or more of the steps of method 500 may be performed by one computing device, while one or more other steps may be performed by another computing device. Alternatively, any and all of the steps of the described method may be performed by a single computing device, which may be a user device, server computer, or another computing device. Further, any steps described in this disclosure as being performed by a particular computing device may, in some embodiments, be performed by a human and/or a different computing device as appropriate.

According to some embodiments, the method 500 may comprise determining RGB values for a digital image, at 502, and determining HSV values for the digital image, at 504. Determining RGB values and/or HSV values for a digital image may comprise one or more of: identifying or otherwise determining a digital image and/or analyzing the digital image to determine respective RGB values and/or HSV values corresponding to one or more pixels of the digital image.

Determining a digital image may comprise, for example, receiving an indication (e.g., from a user via a user interface) of a digital photo stored on a mobile device (e.g., smartphone or tablet computer), selecting an image file from a gallery or media application, or downloading an image file from an email, Internet web site, or external source. In one embodiment, a music generator application allows a user to take a photo or otherwise create a digital image (e.g., using a drawing or art application) that may be used in the music generator application to create music or other audio output.

Determining the RGB values and/or HSV values for the digital image may comprise, according to some embodiments, gathering color data for the image, matching the respective sets of red (R), green (G), and blue (B) values and/or hue (H), saturation (S), and brightness (or luminosity) (V) values that correspond to pixels in the digital image. Some examples of color analysis or color matching that may be useful for determining RGB values and/or HSV values for an image include the color analysis functionality available in the Color Brain color analysis application by BrainScan Software.

The method 500 may comprise determining a tone for the digital image based on the RGB values, at 506. For example, a music generator application may determine one or more tones for a digital image based on the respective RGB values corresponding to one or more pixels of the image.

In some embodiments, determining a tone may comprise determining the tone based on the RGB values and a tonal index. For example, an array or other datastore may be established (e.g., in a settings data database) that associates specific audio frequency values with respective RGB values. In one embodiment, a tonal index array may be established for one or more particular keys, scales and/or chord types.

Determining a tone based on RGB values and a tonal index may comprise summing the individual R, G, and B values for a color and finding a closest match in a tonal index. For example, a deep blue sky color of an image may have RGB values of (0, 80, 149), which sum to a value of 229. A light blue sky color may have RGB values of (0, 191, 255), which sum to 446, and a rosy brown earth color may have RGB values of (188, 143, 143), which sum to 474.

In some embodiments, the sum of the R, G, and B values for a particular color of a digital image may be rounded up or down to the nearest number established in a tonal index for the appropriate scale chosen (e.g., by a user, by default per the application settings, or at random) to apply to that image. For example, a user may have selected (e.g., via a user interface) a major key or a minor key for playing the image.

According to some embodiments, the tonal index may comprise audio frequency values (e.g., in Hz). Determining a tone may comprise finding a nearest Hz match using an operation such as:

$$Hz=\{Index(SC\ Array, Match(MIN(ABS(SC\ Array-T)), ABS(Array-T), 0))\},$$

where "SC Array" defines an array of audio frequencies in Hz for a particular scale (SC) (e.g., major, minor), and T=R+G+B.

According to some embodiments, determining a tone may comprise determining a tone based on a particular scale for an image, allowing for different colors to have different corresponding tones that, when played (e.g., simultaneously and/or in sequence), create a melody. Alternatively, where tones may be determined without matching to a closest frequency in a particular scale in a tonal index (e.g., based on the raw RGB data only), different colors may produce combinations and/or sequences of tones that may be undesirable or displeasing to some users.

The method 500 may comprise determining a volume (which may also be referred to in this disclosure as loudness) (L) for the digital image based on the HSV values, at 508. In some embodiments, a higher color saturation may be represented as a louder tone or musical note. In some embodiments, determining a volume for the digital image based on the HSV values comprises determining the volume based on one or more of the individual H, S, or V values and one or more of the individual R, G, or B values. In accordance with some embodiments, systems, apparatus, articles of manufacture, and processes are described for wherein determining the volume corresponding to a pixel or color based on associated HSV values comprises one or more of:

determining the volume based on the HSV values and the RGB values, determining the volume based on the red value and the hue value, determining the volume based on the green value and the saturation value, determining the volume based on the blue value and the brightness value, determining the volume based on a difference between the red value and the hue value, determining the volume based on a difference between the green value and the saturation value, and determining the volume based on a difference between the blue value and the brightness value.

In one example, the volume of a tone associated with a particular color or pixel may be calculated in accordance with the formula:

$$L=((R-H)^2+(G-S)^2+(B-V)^2))^{1/2}.$$

Determining RGB values, HSV values, tones and/or volume for a digital image may be performed, according to some embodiments, upon selection (e.g., by a user) of the digital image for analysis and/or in response to selection (e.g., by a user or by an auto-play function) of a particular color or pixel of a digital image. For instance, a tone and volume for a color may be determined in response to a request to auto-play an image and/or in response to a user selection of a particular color or pixel by touching a digital image via a touch screen device.

The method 500 may comprise outputting an audio signal based on the tone and the volume, at 510. In some embodiments, outputting the audio signal comprises sending a tone (e.g., represented as an audio frequency value in Hz) and a volume value to a sound buffer for output via an audio output device (e.g., a speaker) of a user device. According to some embodiments, outputting the audio signal may comprise outputting the audio signal using a render callback function.

Alternatively, or in addition, outputting the audio signal may comprise recording a media file (e.g., to music data 296), such as an audio only file (e.g., in an mp3 file format) or a video file comprising the image accompanied by the audio output of the one or more determined tones. Outputting an audio signal may comprise, for example, sharing or distributing a recorded or streamed media file to one or more users and/or for storage on a remote computing device (e.g., a central server, such as a web server, for storing and accessing user-generated content).

According to some embodiments, outputting the audio signal may comprise outputting the audio signal in response to a user selecting one or more portions of a digital image displayed on a display device. In one embodiment, a user may tap or stroke an image displayed on a touch screen of a mobile device, and corresponding notes are generated and output via a speaker of the mobile device based on the colors that the user touched. In some embodiments, a user may play more than one color simultaneously (e.g., using a touch screen configured for multi-touch input).

In another embodiment, a user may initiate an auto-play function that automatically determines a plurality of colors to play and/or an order in which to play the colors. For example, an auto-play function may select pixels of an image at random to play. In another example, an auto-play function may play colors based on a predetermined path or pattern, such as horizontally, diagonally, or vertically back-and-forth across an image, in a circular pattern, or in any other desired pattern established by a user and/or application. In some embodiments, a user may be able to select (e.g., via a user interface) a speed at which the image is played automatically. In some embodiments, auto-play may be represented on a display device by highlighting or otherwise visually marking or distinguishing the portions of the digital image that are being played. In one embodiment, a played portion may be indicated by a visual "ripple" effect displayed at that portion as the corresponding tone is being output.

According to some embodiments, determining a tone, determining a volume, and/or outputting an audio signal may comprise determining one or more settings, and determining a tone, volume, and/or audio signal based on the one or more settings. In some embodiments, settings may be stored, for example, in a settings database (e.g., settings data 294). In one or more embodiments, settings that may be useful in performing one or more one functions described in this disclosure may include one or more of:

- a key to use in determining tones (e.g., A, A#, C, E, F, F#, Ab, etc.)
- a scale to use in determining tones (e.g., major, minor, harmonic minor, pentatonic, whole tone, Ionian mode, Dorian mode, Phrygian mode, Lydian mode, Mixolydian mode, Aeloian mode, Locrian mode)
- a chord type (e.g., Major triad, minor triad, Maj7, minor 3rd, dim 7, etc.) to use in determining one or more background chords to output (e.g., automatically and/or in response to a user-initiated request for a background chord)
- a speed at which to play notes (e.g., in an auto-play mode)
- available types of sounds to use in outputting tones (e.g., ambient, orchestral, woodwinds, drums, haunted, trumpets, etc.)
- a difference threshold value to use in determining tone and/or loudness for one color or pixel based on color information (e.g., RGB values) and/or audio information (e.g., volume) corresponding to another color or pixel
- one or more volume settings to use in determining a volume at which to play notes in one or more modes of play (e.g., auto-play, manual play based on a user's touch, and/or background chord play)

In one example, a tone may be determined using a tonal index that corresponds to a setting for a particular key and/or a setting for a particular scale. In other words, available tones for mapping to color data (e.g., RGB values) may be limited to the specific tones defined by selected keys and/or scales.

According to some embodiments, one or more of various types of settings may be established by default for an music generator application. In some embodiments, one or more types of settings may be selected or modified by a user (e.g., via a user interface).

Figure 6:
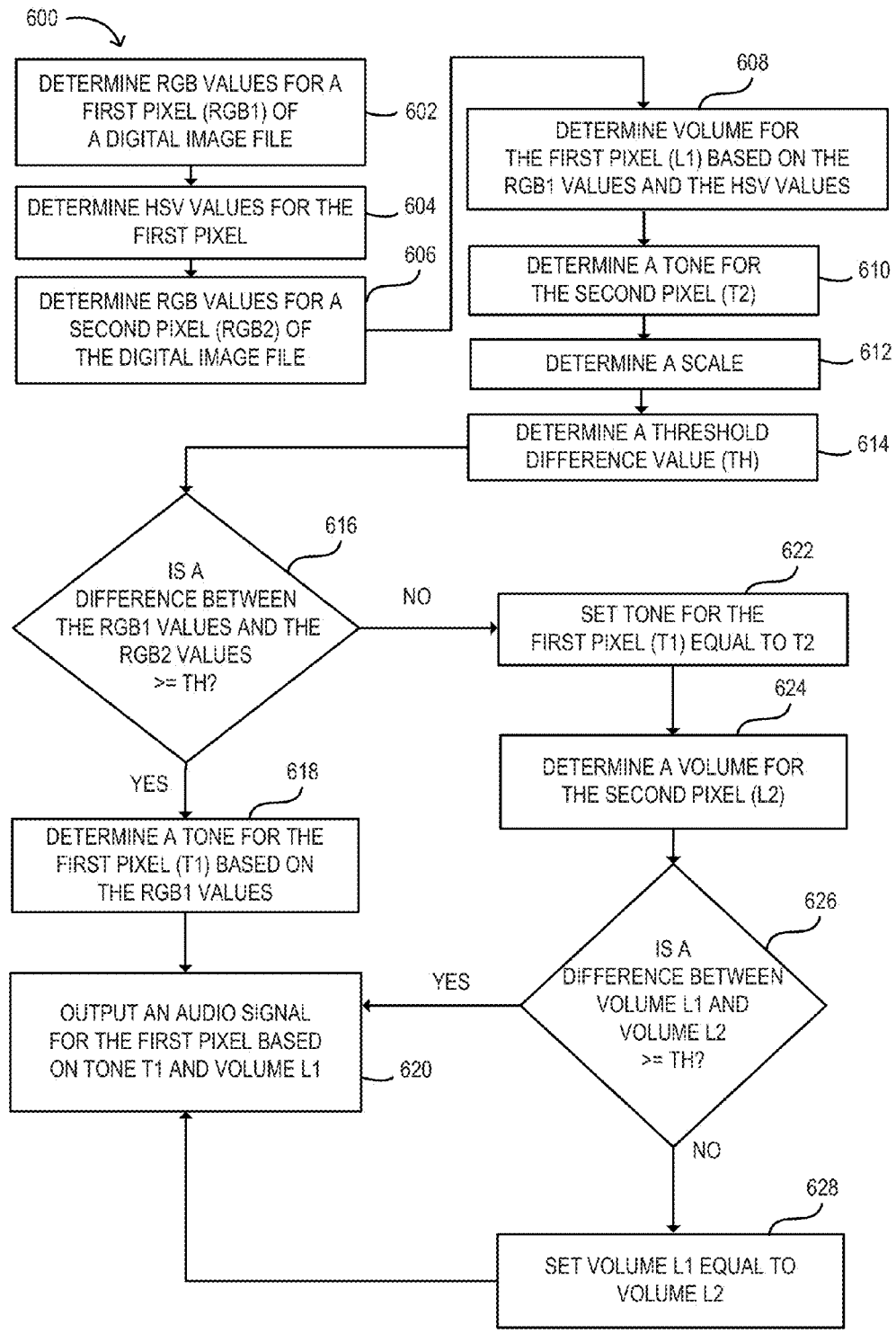
FIG. 6 is a flowchart of a method according to some embodiments.

Referring now to FIG. 6, a flow diagram of a method 600 according to some embodiments is shown. The method 600 may be described in this disclosure as being performed by a user device (e.g., a user's mobile device, such as a phone or tablet computer). However, according to some embodiments, one or more of the steps of method 600 may be performed by one computing device, while one or more other steps may be performed by another computing device. Alternatively, any and all of the steps of the described method may be performed by a single computing device, which may be a user device, server computer, or another computing device. Further, any steps described in this disclosure as being performed by a particular computing device may, in some embodiments, be performed by a human and/or a different computing device as appropriate.

According to some embodiments, the method 600 may comprise determining RGB values for a first pixel (referred to as RGB1 values) of a digital image file, at 602, and determining HSV values for the first pixel, at 604.

The method 600 may comprise determining RGB values for a second pixel (referred to as RGB2 values) of the digital image file, at 606.

The method 600 may comprise determining a volume for the first pixel (referred to as L1) based on the RGB1 values and the HSV values, at 608.

The method 600 may comprise determining a tone for the second pixel (referred to as T2), at 610. For example, determining T2 may comprise looking up previously determined color data and/or music data for the second pixel (e.g., in music data 296).

The method 600 may comprise determining a scale, at 612, and determining a threshold difference value (TH), at 614.

According to some embodiments, the method 600 may comprise determining if a difference between the RGB1 values and the RGB2 values is greater than or equal to TH, at 616. If the difference is less than the difference threshold value TH, the method 600 may comprise determining a tone for the first pixel (T1) based on the RGB1 values, at step 618, and outputting an audio signal based on the tone T1 (as determined at 618) and the volume L1 (as determined at 608), at 620. In one example, determining the tone T1 may comprise summing the respective R, G, and B values of RGB1 and/or looking up an audio frequency in a tonal index.

If, at 616, the difference is not greater than or equal to TH, the method 600 may comprise setting the tone for the first pixel (T1) equal to the tone for the second pixel (T2), at 622, determining a volume for the second pixel (L2), at 624, and determining if a difference between the volume L1 for the first pixel and the volume L2 for the second pixel is greater than or equal to the difference threshold value TH, at 626. If so, the method 600 may comprise outputting an audio signal based on the tone T1 (as set equal to tone T2 at 622) and the volume L1 (as determined at 608), at 620.

If, at 626, the difference is not greater than or equal to the difference threshold value TH, the method 600 may comprise setting the volume L1 for the first pixel equal to volume L2 for the second pixel, at 628, and outputting an audio signal based on the tone T1 (as set equal to tone T2 at 622) and the volume L1 (as set equal to volume L2 at 628), at 620.

Any or all of methods 500 and 600, and other methods described in this disclosure, may involve one or more interface(s). One or more of such methods may include, in some embodiments, providing an interface by and/or through which a user may (i) submit one or more types of information (e.g., upload a photo, input user selections of settings for generating music), and/or (ii) initiate or otherwise generate music or other audio or video output (e.g., by starting an auto-play function and/or touching a touch screen to play colors of an image). Although certain types of information are illustrated in the example interfaces, those skilled in the art will understand that the interfaces may be modified in order to provide for additional types of information and/or to remove some of the illustrated interface elements, as deemed desirable for a particular implementation.

Figure 7:
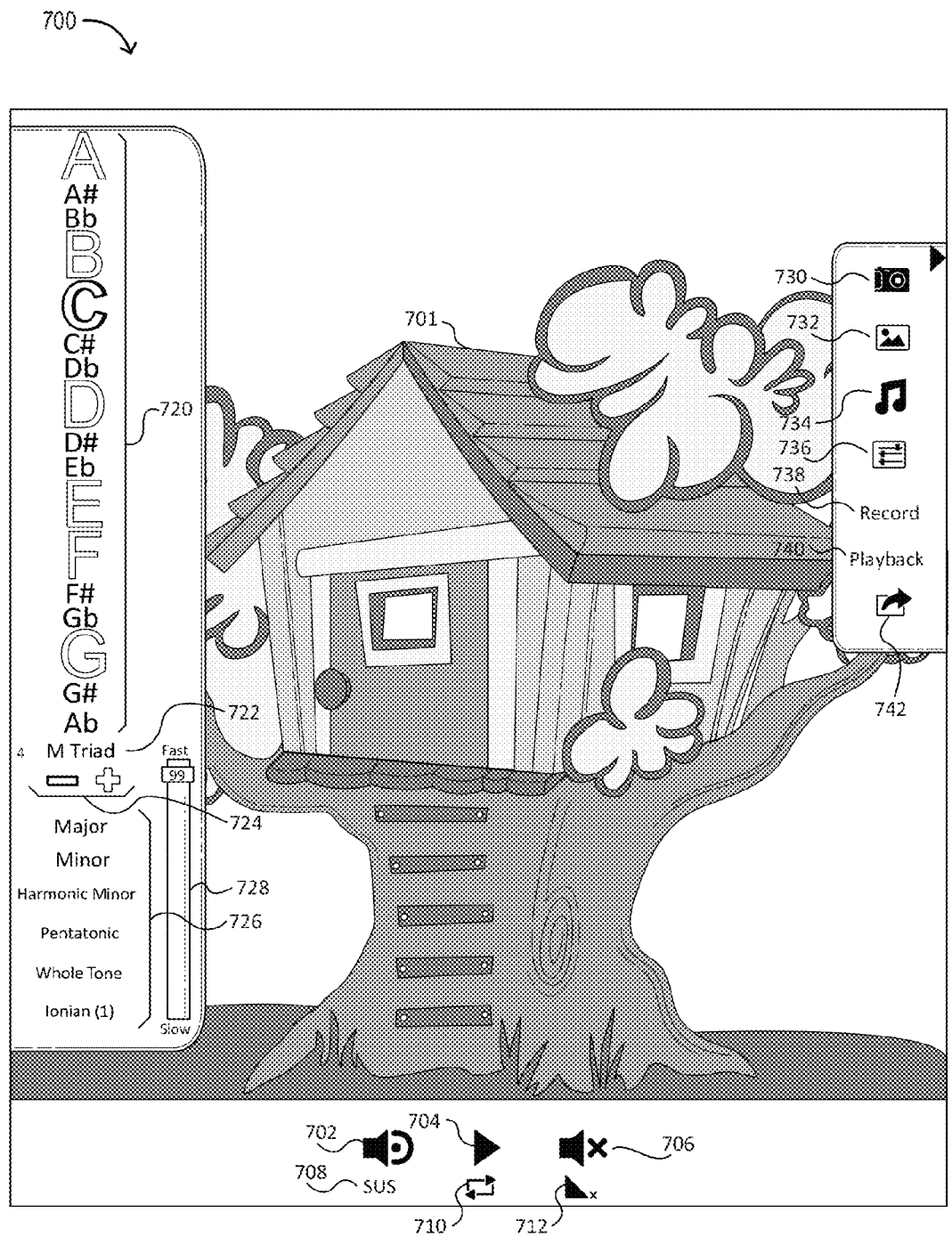
FIG. 7 is a diagram of an example user interface according to some embodiments.

FIG. 7 illustrates an example interface 700 for facilitating creation of audio output (e.g., music) based on one or more digital images. As discussed in this disclosure, the example interface may be provided in accordance with instructions for a software application and/or may be provided via a display device of a mobile device (e.g., tablet computer) or other type of computing device (e.g., a desktop computer).

The example interface 700 includes an example image 701. It will be understood that any type of image may be used in accordance with one or more described embodiments. The displayed image, in some embodiments, may be used in generating music tones and/or other types of audio output.

The example interface 700 further may include a background chord element 702, an auto-play element 704, a mute element 706, a sustain element 708, an auto-play pattern selection element 710, and/or a diminish element 712. The background chord element 702 may be used for outputting one or more chords in response to a user actuating (e.g., pressing on a touch screen) the background chord element. For example, a user may press background chord element 702 to generate a particular chord (e.g., based on one or more user settings).

The auto-play element 704, for example, may be used to initiate an auto-play function for automatically generating audio output based on the image 701 without requiring user input. In some embodiments, a user may be able to select an auto-play pattern using auto-play pattern selection element 710. For example, a plurality of different auto-play patterns may be available (e.g., horizontal, vertical, diagonal, random, etc.) and the user may be able to toggle or cycle through the available patterns. Then, when the auto-play function is initiated (e.g., by the user pressing auto-play element 704), the auto-play function plays the image in accordance with the currently selected auto-play pattern. An auto-play speed element 728 may be included to allow the user to select a speed (e.g., by choosing a position on the slider between "fast" and "slow") at which the auto-play function "plays" or outputs notes based on the image 701. Another example of auto-play is discussed further with respect to example interface 800 of FIG. 8.

The mute element 706 may be used by a user to mute all current output, which may include one or more of a background chord, notes output based on an auto-play function, and/or manual play by a user. The sustain element 708 may be used for sustaining current audio output, in a manner similar to a sustain pedal on a piano. For example, a sustain function may be actuated in accordance with application instructions so that when a user presses the sustain element 708, all the notes currently being played will continue to be output until the sustain function finishes at a predetermined time and/or until the sustain function is terminated in response to user input (e.g., until the user stops pressing the element, until the user presses the diminish element 712, or until the user presses the sustain element 708 again). In one embodiment, the duration of the sustain function may be established and/or modified by a user. For example, the duration of the sustain function may be set by a user (e.g., using the auto-play speed element 728 or the like) and stored (e.g., in settings data 294). The diminish element 712 may be pressed or otherwise actuated by a user to diminish or fade out any notes currently being played.

The example interface 700 may further include various types of interface elements corresponding to different types of settings for creating audio output. Key selection element 720 allows a user to select a key setting (e.g., by pressing a desired key from among the displayed key options). In one example, a user presses the "C" so that any notes generated for background chords, for auto-play, and/or for manual play are restricted to the key of C. Similarly, scale selection element 726 allows a user to select a scale for use in generating background chords, auto-play notes, and/or manually played notes. In one example, a user presses the "Major" option so that any notes generated for background chords, for auto-play, and/or for manual play are restricted to the major scale of the selected key (e.g., the key of C).

The example interface 700 further may include a chord selection element 724 for allowing a user to select a type of chord 722. For example, a user may press the "−" or "+" buttons to cycle through available chords. In some embodiments, the set of one or more available chords may be established (e.g., in a settings database, such as settings 294) and/or determined based on a selected scale (e.g., selected by a user using scale selection element 726). In one example, the selected chord may be used for determining a background chord to play (e.g., in response to the user pressing background chord element 702).

The example interface 700 further may include a photo capture element 730 for allowing a user to take a picture, using a camera of a mobile device, to use in generating audio output. In one example, the photo capture element 730 launches a photo application and returns one or more captured digital photos to the application for creating music. The example image selection element 732 similarly allows the user to select one or more stored images for use in creating audio output. Images may be retrieved, for example, from the internal storage of a mobile device (e.g., using a photo or media gallery application to browse stored image files), an external memory, a remote server (e.g., a web server running a photo sharing service), etc.

The example interface 700 further may include a sound settings element 734. Selecting the sound settings element 734 may allow the user access (e.g., via an interface) to sound options for generating audio based on the displayed image. For example, the user may be able to select one or more respective types of sounds, instruments, and/or modes from a list of available options for generating background chords, notes from auto-play, and/or notes from manual play. For instance, the user may be able to select a first type of instrument or music mode (e.g., woodwinds) for generating music when the user touches a touch screen, a second type for generating notes in auto-play mode, and a third type of sounds for generating background chords. A user also may be able to save sets of one or more settings as respective presets, allowing the user to switch easily from one set of settings to another (e.g., by pressing a corresponding interface element).

According to some embodiments, a user may also be able to select whether to utilize a difference threshold value (e.g., turning a 3D loudness mode on or off) in creating music and/or the sensitivity (e.g., high or low) or magnitude of the difference threshold value. For example, according to some embodiments, a larger difference threshold value may correspond to a low sensitivity mode in which fewer different notes are generated for an image, and a smaller difference threshold value (a more color-sensitive mode) may correspond to a larger number of different notes being generated for an image.

The example interface 700 further may include a volume setting 736 for setting respective volumes for different available play modes. Accordingly, a user may be able to set different volumes for playback of a background chord, auto-play, and/or notes generated manually by a user (e.g., by touching a touch screen).

The example interface 700 further may include a record element 738 for initiating recording of audio generated by a music generator application. For example, pressing the record element 738 may initiate recording a music file and/or video file (e.g., for storage in music data 296) based on music currently being output by a music generator application. In some embodiments, the record element 738 may further allow for pausing and/or stopping a recording. An example playback element 740 initiates playback of at least one recorded file when pressed by a user. An example sharing element 742 may allow a user to transmit any available recorded files (e.g., audio and/or video files) to one or more other users via email, short messaging service (SMS), or the like, to transmit or upload files to a server for hosting and/or sharing recorded files (e.g., a web server, a server computer 102, and/or central controller device 152), and/or to post or otherwise share files via a social media or media sharing service (e.g., Facebook, Flickr, YouTube.com, Twitter).

Figure 8:
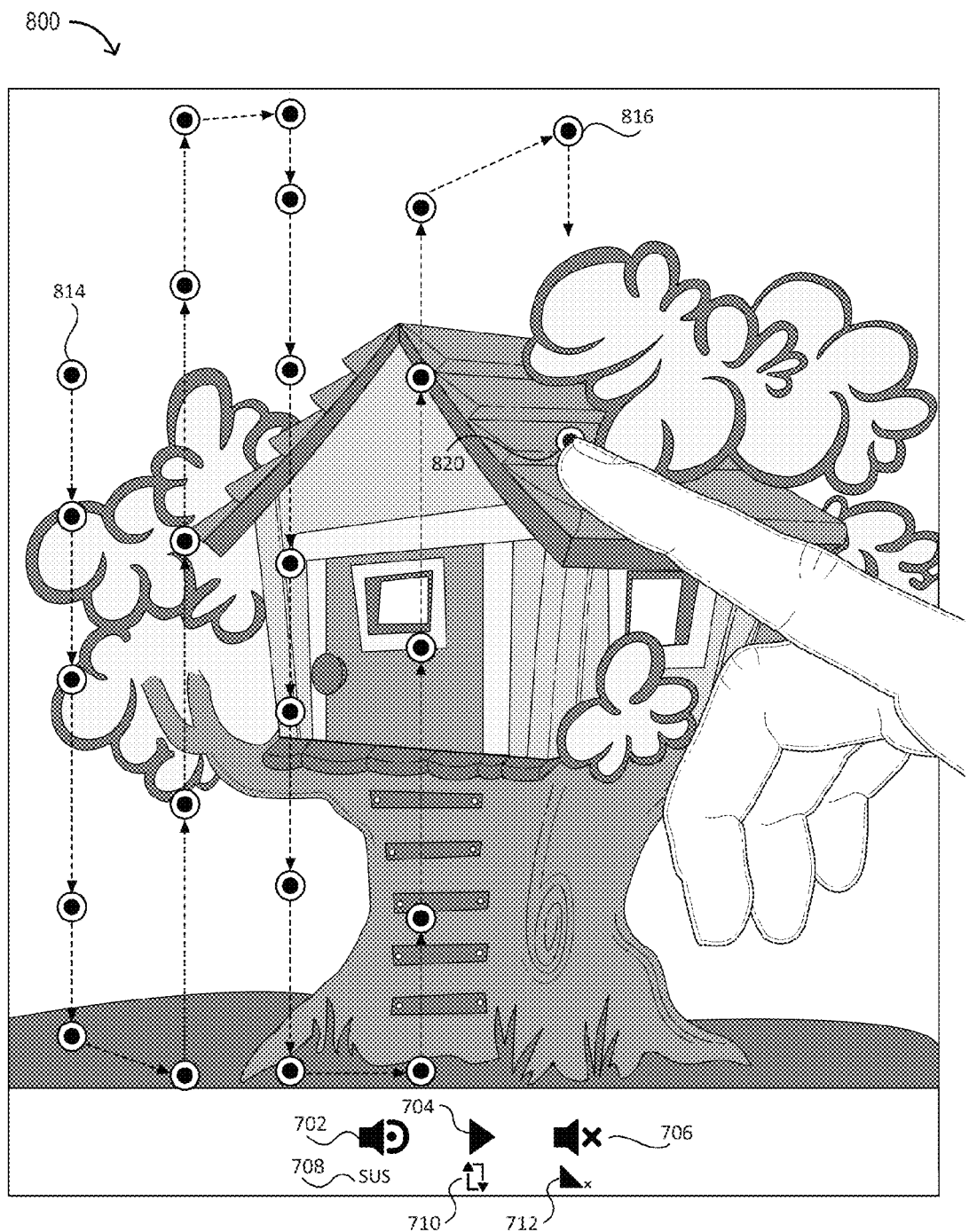
FIG. 8 is a diagram of an example user interface according to some embodiments.

FIG. 8 illustrates an example interface 800 depicting examples of an auto-play mode and manual play of a digital image (e.g., using a music generator application). As shown in FIG. 8, a user pressing the auto-play element 704 may initiate an auto-play function that automatically generates audio output based on the displayed image 701, without requiring user input, by selecting portions of the image and outputting corresponding tones. In one example, once auto-play mode is initiated, a music generator application determines an auto-play pattern and selects a first play point 820 based on the pattern. For example, the application may select a first play point at random or according to a predetermined vertical or horizontal pattern (e.g., sets of specific x, y coordinates of the image) and determine a corresponding tone or note (e.g., based on user-selected settings) for the first play point. After outputting the first tone, the next play point is selected in accordance with the auto-play pattern, and the corresponding tone is determined and output, and so on, until the pattern is completed. As depicted in example interface 800, auto-play may proceed back and forth in a vertical pattern, starting at play point 820 and proceeding through multiple play points (generating multiple respective tones) including play point 822. In some embodiments, the speed at which notes are played in auto-play mode may be based on a selected speed of play.

Example interface 800 further depicts an example of manual play by a user of the example image at play point 820. For instance, the user touches the image at play point 820 via the user interface, and a music generator application generates and/or outputs a tone based on the color data for the image at the play point 820. The user may, in some embodiments, be able to manually play the image while the auto-play mode and/or background chords are also being played.

According to one example application in accordance with some embodiments, an application for tablet computers and/or smartphones enable users to "musically play" a picture or live visual image, record it, and share it with others. The example application provides for acquiring an image, analyzing the image, playing the image, and sharing the played image with friends (e.g., via a social networking service). Many types of phones and tablet devices have the ability to take a picture, or a user can use an existing picture from those stored on a user's device (from the Web, email, etc.). Using finger taps and/or strokes (or having an image "auto-played" with a choice of speed), a musical melody can be played using the example application with a visual response of light or color (e.g., a visual modification of the image to indicate where the image was touched or played). More than one finger (and/or stylus) may be used to play an image, allowing for multiple notes to be played concurrently.

According to the example application, the application may include in-app advertising in a free or lower cost variation, and may not include in-app advertising in a paid or premium version. A user may be able to upgrade the application by paying to unlock additional music sounds or styles, or increasing the length of the generated music.

According to some embodiments, using a live image could create a constantly changing melody, as the image changes. A user could create/conduct music from a live image.

According to some embodiments, multiple users may create music using the same or different images, and the example application may be configured to allow one user to hear or otherwise receive the music being created by another user (e.g., if the devices are in communication via the Internet) and/or allow two (or more) persons to play the same or different images at the same time. In one embodiment, the users may not be sharing massive amounts of audio data, but merely data describing where the users are touching the image, there may not be the same latency problem currently experienced by multi-stream (audio) communications. In one example, several people using the application synchronously together could create a "virtual orchestra" made up of live moving images being manipulated by the users. In another example, a company of dancers may be able to create music through movement analyzed (e.g., via a camera) by the example application.

According to some embodiments, a music generator application may be used as an aid for visually impaired persons to "hear an image" thus functioning as a "accessibility application" for people with disabilities. In one example, a "live motion" mode may allow a visually impaired person to be able to tell if someone is shaking his head "no" or nodding in affirmation, or if someone or something was coming closer to them (e.g., based on the determined loudness or volume of generated tones).

As discussed in this disclosure, a volume value may be determined for a given color in an image. The particular note in a particular part of a picture is played at a volume based on the determined volume. In one example, generally objects that are closer to a photographer are more color saturated. The hue, saturation, and brightness factors accordingly may have higher valuations. As discussed in this disclosure, a loudness value may be determined based on the half square of the sums of the squares of the differences between the RGB data and the HSV data for a given color or pixel.

Some embodiments may provide for 3D or virtual applications. For instance, it may be possible to create from a moving, changing, or live video image, a musical performance using hands, bodies or any moving objects, where closer objects may be interpreted as louder notes, for example. In another example, the loudness value of an image portion/object allows for creating a three dimensional location plane or the "z" coordinate in any three dimensional x,y,z plot points (where x,y correspond to the 2-dimensional axes and z corresponds to the third). Mapping the color data (RGB and HSV) to a 3D representation may accordingly allow visually impaired persons to 1) hear color, 2) determine object distance from them, and/or 3) determine gestures aurally such as nodding head yes or no (like a color "radar").

According to some embodiments, multiple musical notes may be auto-played or touched on a screen by a user. In one embodiment, the way that a user touches a screen (e.g., for how long) may affect the created sound. In some embodiments, the user may be able to choose the type of device being represented as playing the image when the image is touched. For example, the user's finger may play the image as a bow, a mallet, a rock, a feather, etc.

According to some embodiments, an example application provides a visual representation of a piano keyboard (e.g., beneath the picture) or other instrument via a user interface such that when a note on the piano keyboard is touched, it indicates where in the picture the corresponding color exists for that particular note. Some embodiments provide for the reverse action, in which when a user touches a color point (pixel) on the picture, the corresponding note of the piano keyboard is indicated. Accordingly, users may be able to learn the color tones of the image.

According to some embodiments, an alternative or additional application may provide (e.g., separate from or integral with one or more of the features described above) for one or more of: (1) sampling sound from a microphone (or other audio input device) and analyzing the hertz tones (notes) within the input sound (e.g., using one or more of the features above); (2) showing the incoming tones on an existing picture; (3) revealing the incoming tones on an existing picture (e.g., whereby the screen begins black and as a note is "heard" by the application that part of the picture is revealed); and/or (4) starting with a black canvas, creating colors that would "paint" a picture almost as if it were an "old player piano roll", but made with color (e.g., generating a unique color painted composition based upon what the application "heard"). In one example, a symphony orchestra could use the approach to create visual imagery and attract a wider audience.

Numerous embodiments are described in this patent application, and are presented for illustrative purposes only. The described embodiments are not, and are not intended to be, limiting in any sense. The presently disclosed invention(s) are widely applicable to numerous embodiments, as is readily apparent from the disclosure. One of ordinary skill in the art will recognize that the disclosed invention may be practiced with various modifications and alterations, such as structural, logical, software, and/or electrical modifications. Although particular features of the disclosed invention(s) may be described with reference to one or more particular embodiments and/or drawings, it should be understood that such features are not limited to usage in the one or more particular embodiments or drawings with reference to which they are described, unless expressly specified otherwise.

The present disclosure is neither a literal description of all embodiments nor a listing of features that must be present in all embodiments.

Neither the Title (set forth at the beginning of the first page of this disclosure) nor the Abstract (set forth at the end of this disclosure) is to be taken as limiting in any way the scope of the disclosed invention(s).

Throughout the description and unless otherwise specified, the following terms may include and/or encompass the example meanings provided below. These terms and illustrative example meanings are provided to clarify the language selected to describe embodiments both in the specification and in the appended claims, and accordingly, are not intended to be limiting.

The phrase "based on" does not mean "based only on", unless expressly specified otherwise. In other words, the phrase "based on" describes both "based only on" and "based at least on".

As used in this disclosure, a "user" may generally refer to any individual and/or entity that operates a user device.

Some embodiments may be associated with a "user device" or a "network device". As used in this disclosure, the terms "user device" and "network device" may be used interchangeably and may generally refer to any device that can communicate via a network. Examples of user or network devices include a personal computer (PC), a workstation, a server, a printer, a scanner, a facsimile machine, a copier, a personal digital assistant (PDA), a storage device (e.g., a disk drive), a hub, a router, a switch, and a modem, a video game console, or a wireless phone. User and network devices may comprise one or more communication or network components.

Some embodiments may be associated with a "network" or a "communication network". As used in this disclosure, the terms "network" and "communication network" may be used interchangeably and may refer to any object, entity, component, device, and/or any combination thereof that permits, facilitates, and/or otherwise contributes to or is associated with the transmission of messages, packets, signals, and/or other forms of information between and/or within one or more network devices. In some embodiments, networks may be hard-wired, wireless, virtual, neural, and/or any other configuration or type of network that is or becomes known. Networks may comprise any number of computers and/or other types of devices in communication with one another, directly or indirectly, via a wired or wireless medium such as the Internet, LAN, WAN or Ethernet (or IEEE 802.3), Token Ring, RF, cable TV, satellite links, or via any appropriate communications means or combination of communications means. In some embodiments, a network may include one or more wired and/or wireless networks operated in accordance with any communication standard or protocol that is or becomes known or practicable. Exemplary protocols for network communications include but are not limited to: the Fast Ethernet LAN transmission standard 802.3-2002® published by the Institute of Electrical and Electronics Engineers (IEEE), Bluetooth™, Time Division Multiple Access (TDMA), Code Division Multiple Access (CDMA), Global System for Mobile communications (GSM), Enhanced Data rates for GSM Evolution (EDGE), General Packet Radio Service (GPRS), Wideband CDMA (WCDMA), Advanced Mobile Phone System (AMPS), Digital AMPS (D-AMPS), IEEE 802.11 (WI-FI), IEEE 802.3, SAP, the best of breed (BOB), system to system (S2S), or the like. Communication between and/or among devices may be encrypted to ensure privacy and/or prevent fraud in any one or more of a variety of ways well known in the art.

Devices that are in communication with each other need not be in continuous communication with each other, unless expressly specified otherwise. On the contrary, such devices need only transmit to each other as necessary or desirable, and may actually refrain from exchanging data most of the time. For example, a machine in communication with another machine via the Internet may not transmit data to the other machine for weeks at a time. In addition, devices that are in communication with each other may communicate directly or indirectly through one or more intermediaries.

As used in this disclosure, the terms "information" and "data" may be used interchangeably and may refer to any data, text, voice, video, image, message, bit, packet, pulse, tone, waveform, and/or other type or configuration of signal and/or information. Information may comprise information packets transmitted, for example, in accordance with the Internet Protocol Version 6 (IPv6) standard as defined by "Internet Protocol Version 6 (IPv6) Specification" RFC 1883, published by the Internet Engineering Task Force (IETF), Network Working Group, S. Deering et al. (December 1995). Information may, according to some embodiments, be compressed, encoded, encrypted, and/or otherwise packaged or manipulated in accordance with any method that is or becomes known or practicable.

In addition, some embodiments described in this disclosure are associated with an "indication". The term "indication" may be used to refer to any indicia and/or other information indicative of or associated with a subject, item, entity, and/or other object and/or idea. As used in this disclosure, the phrases "information indicative of" and "indicia" may be used to refer to any information that represents, describes, and/or is otherwise associated with a related entity, subject, or object. Indicia of information may include, for example, a code, a reference, a link, a signal, an identifier, and/or any combination thereof and/or any other informative representation associated with the information. In some embodiments, indicia of information (or indicative of the information) may be or include the information itself and/or any portion or component of the information. In some embodiments, an indication may include a request, a solicitation, a broadcast, and/or any other form of information gathering and/or dissemination.

"Determining" something may be performed in a variety of manners and therefore the term "determining" (and like terms) includes calculating, computing, deriving, looking up (e.g., in a table, database or data structure), ascertaining, recognizing, and the like.

A "processor" means any one or more microprocessors, Central Processing Unit (CPU) devices, computing devices, microcontrollers, digital signal processors, or like devices. Examples of processors include, without limitation, INTEL's PENTIUM, AMD's ATHLON, or APPLE's A6 processor.

When a single device or article is described in this disclosure, more than one device or article (whether or not they cooperate) may alternatively be used in place of the single device or article that is described. Accordingly, the functionality that is described as being possessed by a device may alternatively be possessed by more than one device or article (whether or not they cooperate). Where more than one device or article is described in this disclosure (whether or not they cooperate), a single device or article may alternatively be used in place of the more than one device or article that is described. For example, a plurality of computer-based devices may be substituted with a single computer-based device. Accordingly, functionality that is described as being possessed by more than one device or article may alternatively be possessed by a single device or article. The functionality and/or the features of a single device that is described may be alternatively embodied by one or more other devices that are described but are not explicitly described as having such functionality and/or features. Thus, other embodiments need not include the described device itself, but rather may include the one or more other devices that would, in those other embodiments, have such functionality/features.

A description of an embodiment with several components or features does not imply that any particular one of such components and/or features is required. On the contrary, a variety of optional components are described to illustrate the wide variety of possible embodiments of the present invention(s). Unless otherwise specified explicitly, no component and/or feature is essential or required.

Further, although process steps, algorithms or the like may be described or depicted in a sequential order, such processes may be configured to work in one or more different orders. In other words, any sequence or order of steps that may be explicitly described or depicted does not necessarily indicate a requirement that the steps be performed in that order. The steps of processes described in this disclosure may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications, does not imply that the illustrated process or any of its steps is necessary to the invention, and does not imply that the illustrated process is preferred.

It will be readily apparent that the various methods and algorithms described in this disclosure may be implemented by, e.g., appropriately- and/or specially-programmed general purpose computers and/or computing devices. Typically a processor (e.g., one or more microprocessors) will receive instructions from a memory or like device, and execute those instructions, thereby performing one or more processes defined by those instructions. Further, programs that implement such methods and algorithms may be stored and transmitted using a variety of media (e.g., computer-readable media) in a number of manners. In some embodiments, hardwired circuitry or custom hardware may be used in place of, or in combination with, software instructions for implementation of the processes of various embodiments. Thus, embodiments are not limited to any specific combination of hardware and software.

Accordingly, a description of a process likewise describes at least one apparatus for performing the process, and likewise describes at least one computer-readable medium and/or computer-readable memory for performing the process. The apparatus that performs a described process may include components and/or devices (e.g., a processor, input and output devices) appropriate to perform the process. A computer-readable medium may store program elements and/or instructions appropriate to perform a described method.

The term "computer-readable medium" refers to any medium that participates in providing data (e.g., instructions or other information) that may be read by a computer, a processor, or a like device. Various forms of computer-readable media may be involved in carrying data, including sequences of instructions, to a processor. For example, sequences of instruction (i) may be delivered from RAM to a processor, (ii) may be carried over a wireless transmission medium, and/or (iii) may be formatted according to any one or more of various known formats, standards, or protocols (some examples of which are described in this disclosure with respect to communication networks).

Computer-readable media may take many forms, including but not limited to, non-volatile media, volatile media, and transmission media. Non-volatile media may include, for example, optical or magnetic disks and other types of persistent memory. Volatile media may include, for example, DRAM, which typically constitutes the main memory for a computing device. Transmission media may include, for example, coaxial cables, copper wire, and fiber optics, including the wires that comprise a system bus coupled to the processor. Transmission media may include or convey acoustic waves, light waves, and electromagnetic emissions, such as those generated during RF and IR data communications. Common forms of computer-readable media include, for example, a floppy disk, a flexible disk, a hard disk, magnetic tape, any other magnetic medium, a CD-ROM, DVD, any other optical medium, a punch card, paper tape, any other physical medium with patterns of holes, a RAM, a PROM, an EPROM, a FLASH-EEPROM, a Universal Serial Bus (USB) memory stick or thumb drive, a dongle, any other memory chip or cartridge, a carrier wave, or any other medium from which a computer can read.

The term "computer-readable memory" may generally refer to a subset and/or class of non-transitory computer-readable medium that does not include intangible or transitory signals, waves, waveforms, carrier waves, electromagnetic emissions, or the like. Computer-readable memory may typically include physical, non-transitory media upon which data (e.g., instructions or other information) are stored, such as optical or magnetic disks and other persistent memory, DRAM, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, USB devices, any other memory chip or cartridge, and the like.

Where databases are described, it will be understood by one of ordinary skill in the art that (i) alternative database structures to those described may be readily employed, and (ii) other memory structures besides databases may be readily employed. Any illustrations or descriptions of any sample databases presented in this disclosure are illustrative arrangements for stored representations of information. Any number of other arrangements may be employed besides those suggested by, e.g., tables illustrated in drawings or elsewhere. Similarly, any illustrated entries of the databases represent exemplary information only; one of ordinary skill in the art will understand that the number and content of the entries may be different from those described in this disclosure.

Further, despite any depiction of the databases as tables, other formats (including relational databases, object-based models, hierarchical electronic file structures, and/or distributed databases) could be used to store and/or manipulate the described data. Likewise, object methods or behaviors of a database may be used to implement one or more of various processes, such as those described in this disclosure. In addition, the databases may, in a known manner, be stored locally and/or remotely from a device that accesses data in such a database. Furthermore, while unified databases may be contemplated, it is also possible that the databases may be distributed and/or duplicated amongst a variety of devices.

The present disclosure provides, to one of ordinary skill in the art, an enabling description of several embodiments and/or inventions. Some of these embodiments and/or inventions may not be claimed in the present application, but may nevertheless be claimed in one or more continuing applications that claim the benefit of priority of the present application. Applicants intend to file additional applications to pursue patents for subject matter that has been disclosed and enabled but not claimed in the present application.

What is claimed is:

1. A method, comprising:
 determining, by a computer comprising at least one processor, a red value (R), a green value (G), and a blue value (B) (RGB values) corresponding to a first pixel of a digital image file;
 determining, by the computer, a hue value (H), a saturation value (S), and a brightness value (V) (HSV values) corresponding to the first pixel;
 determining, by the computer, a tone corresponding to the first pixel based on the RGB values;
 determining, by the computer, a volume (L) corresponding to the first pixel based on the HSV values;
 outputting, by the computer via an audio output device, an audio signal based on the tone and the volume;
 determining a difference threshold value; and
 wherein the method provides for at least one of the following:
  using the difference threshold value to determine the tone based on color information associated with the first pixel and color information associated with a second pixel, and
  using the difference threshold value to determine the volume based on the color information associated with the first pixel and the color information associated with the second pixel.

2. The method of claim 1, wherein determining the volume corresponding to the first pixel based on the HSV values comprises:
 determining the volume corresponding to the first pixel based on the HSV values and the RGB values.

3. The method of claim 1, further comprising:
 determining a first volume corresponding to the second pixel;
 determining a volume difference between the first volume corresponding to the second pixel and the volume corresponding to the first pixel; and
 determining a second volume corresponding to the second pixel based on the volume difference between the first volume corresponding to the second pixel and the volume corresponding to the first pixel.

4. The method of claim 3, further comprising:
 determining that the volume difference between the first volume corresponding to the second pixel and the volume corresponding to the first pixel is not less than the difference threshold value; and
 wherein determining the second volume comprises:
 setting the second volume equal to the first volume corresponding to the second pixel.

5. The method of claim 3, further comprising:
 determining that the volume difference between the first volume corresponding to the second pixel and the volume corresponding to the first pixel is less than the difference threshold value; and
 wherein determining the second volume comprises:
 setting the second volume equal to the volume corresponding to the first pixel.

6. A method, comprising:
 determining, by a computer comprising at least one processor, a red value (R), a green value (G), and a blue value (B) (RGB values) corresponding to a first pixel of a digital image file;
 determining, by the computer, a hue value (H), a saturation value (S), and a brightness value (V) (HSV values) corresponding to the first pixel;
 determining, by the computer, a tone corresponding to the first pixel based on the RGB values;
 determining, by the computer, a volume (L) corresponding to the first pixel based on the HSV values;
 outputting, by the computer via an audio output device, an audio signal based on the tone and the volume,
 wherein determining the tone corresponding to the first pixel based on the RGB values comprises:
 calculating a sum of the RGB values;
 receiving an indication of a scale selected by a user;
 determining a tonal index corresponding to the scale; and
 determining a frequency in the tonal index that is the closest match to the sum of the RGB values.

7. The method of claim 6, wherein determining the tone corresponding to the first pixel based on the RGB values comprises at least one of:
 determining a key for the tone;
 determining a scale for the tone; and
 determining a chord for the scale.

8. The method of claim 6, wherein determining the volume corresponding to the first pixel based on the HSV values comprises:
 calculating the volume according to the formula:

$$L=((R-H)^2+(G-S)^2+(B-V)^2))^{(1/2)}.$$

9. The method of claim 6, further comprising:
 determining a first tone corresponding to a second pixel;
 determining a difference between the first tone corresponding to the second pixel and the tone corresponding to the first pixel; and
 determining a second tone corresponding to the second pixel based on the difference between the first tone corresponding to the second pixel and the tone corresponding to the first pixel.

10. The method of claim 9, further comprising:
 determining that the difference between the first tone corresponding to the second pixel and the tone corresponding to the first pixel is not less than a predetermined difference threshold value; and
 wherein determining the second tone comprises:
 setting the second tone equal to the first tone corresponding to the second pixel.

11. The method of claim 9, further comprising:
 determining that the difference between the first tone corresponding to the second pixel and the tone corresponding to the first pixel is less than a predetermined difference threshold value; and
 wherein determining the second tone comprises:

setting the second tone equal to the tone corresponding to the first pixel.

12. The method of claim 6, further comprising:
  determining a red value (R2), a green value (G2), and a blue value (B2) (RGB2 values) corresponding to a second pixel;
  determining a difference between the RGB2 values corresponding to the second pixel and the RGB values corresponding to the first pixel; and
  determining a tone corresponding to the second pixel based on the difference between the RGB2 values corresponding to the second pixel and the RGB values corresponding to the first pixel.

13. The method of claim 12, wherein determining the difference between the RGB2 values corresponding to the second pixel and the RGB values corresponding to the first pixel comprises:
  calculating a color difference (D) according to the formula:

$$D=((R-R2)^2+(G-G2)^2+(B-B2)^2))^{(1/2)}.$$

14. The method of claim 12, wherein determining the tone corresponding to the second pixel comprises:
  determining that the difference between the RGB2 values corresponding to the second pixel and the RGB values corresponding to the first pixel is not less than a predetermined difference threshold value; and
  determining the tone corresponding to the second pixel based on a sum of the RGB2 values.

15. The method of claim 12, wherein determining the tone corresponding to the second pixel comprises:
  determining that the difference between the RGB2 values corresponding to the second pixel and the RGB values corresponding to the first pixel is less than a predetermined difference threshold value; and
  setting the tone corresponding to the second pixel equal to the tone corresponding to the first pixel.

16. The method of claim 6, further comprising:
  determining a speed of an auto-play function; and
  determining a play pattern of the auto-play function; and
  wherein outputting the audio signal based on the tone and the volume comprises:
    outputting the audio signal in accordance with the auto-play function based on the speed and the play pattern.

17. The method of claim 6, further comprising:
  outputting at least one background chord;
  outputting a second audio signal in accordance with an auto-play function; and
  wherein outputting the audio signal based on the tone and the volume comprises:
    receiving, from a user via a user interface, a signal to produce the output signal; and
    outputting the audio signal in response to receiving the signal from the user.

18. An apparatus comprising:
a processor;
a computer readable storage device in communication with the processor, the computer readable storage device storing instructions configured to direct the processor to perform:
  determining a red value (R), a green value (G), and a blue value (B) (RGB values) corresponding to a first pixel of a digital image file;
  determining a hue value (H), a saturation value (S), and a brightness value (V) (HSV values) corresponding to the first pixel;
  determining a tone corresponding to the first pixel based on the RGB values;
  determining a volume (L) corresponding to the first pixel based on the HSV values; and
  outputting, via an audio output device, an audio signal based on the tone and the volume,
  wherein determining the tone corresponding to the first pixel based on the RGB values comprises:
  calculating a sum of the RGB values;
  receiving an indication of a scale selected by a user;
  determining a tonal index corresponding to the scale; and
  determining a frequency in the tonal index that is the closest match to the sum of the RGB values.

19. The apparatus of claim 18, wherein the instructions are further configured to direct the processor to perform:
  determining a speed of an auto-play function; and
  determining a play pattern of the auto-play function; and
  wherein outputting the audio signal based on the tone and the volume comprises:
    outputting the audio signal in accordance with the auto-play function based on the speed and the play pattern.

20. The apparatus of claim 18, wherein the instructions are further configured to direct the processor to perform:
  outputting at least one background chord;
  outputting a second audio signal in accordance with an auto-play function; and
  wherein outputting the audio signal based on the tone and the volume comprises:
    receiving, from a user via a user interface, a signal to produce the output signal; and
    outputting the audio signal in response to receiving the signal from the user.

\* \* \* \* \*